United States Patent [19]
Matsuyama

[11] Patent Number: 5,920,379
[45] Date of Patent: Jul. 6, 1999

[54] PROJECTION EXPOSURE METHOD AND APPARATUS

[75] Inventor: Tomoyuki Matsuyama, Foster City, Calif.

[73] Assignee: Nikon Corporation, Tokyo, Japan

[21] Appl. No.: 09/138,302

[22] Filed: Aug. 21, 1998

Related U.S. Application Data

[62] Division of application No. 08/724,167, Sep. 30, 1996, Pat. No. 5,822,044.

[51] Int. Cl.$^6$ .............................. G03B 27/54; G02B 9/60
[52] U.S. Cl. ................................................ 355/67; 359/766
[58] Field of Search ................................. 355/53, 67, 77, 355/75; 359/683, 759, 765, 766, 763; 350/463–465, 423–425; 250/201.1, 201.2

[56] References Cited

U.S. PATENT DOCUMENTS

| | | | |
|---|---|---|---|
| 3,458,250 | 7/1969 | Bechtold | 350/466 |
| 3,504,961 | 4/1970 | Hoogland et al. | |
| 3,897,138 | 7/1975 | Kano | |
| 3,909,115 | 9/1975 | Kano | |
| 4,497,015 | 1/1985 | Konno et al. | |
| 4,666,273 | 5/1987 | Shimizu et al. | |
| 4,770,477 | 9/1988 | Shafer | |
| 4,772,107 | 9/1988 | Friedman | |
| 4,811,055 | 3/1989 | Hirose | |
| 4,891,663 | 1/1990 | Hirose | |
| 4,892,397 | 1/1990 | Horiuchi | 350/425 |
| 4,918,583 | 4/1990 | Kudo et al. | |
| 5,061,051 | 10/1991 | Miyamae | 359/683 |
| 5,105,075 | 4/1992 | Ohta et al. | |
| 5,170,207 | 12/1992 | Tezuka et al. | |
| 5,245,384 | 9/1993 | Mori | |
| 5,260,832 | 11/1993 | Togino et al. | |
| 5,335,044 | 8/1994 | Shiraishi | |
| 5,420,417 | 5/1995 | Shiraishi | |

FOREIGN PATENT DOCUMENTS

| | | |
|---|---|---|
| 47-35017 | 9/1972 | Japan |
| 63-118115 | 6/1986 | Japan |
| 5-173065 | 7/1992 | Japan |
| 6-313845 | 11/1994 | Japan |

*Primary Examiner*—Safet Metjahic
*Assistant Examiner*—Hung Henry Nguyen
*Attorney, Agent, or Firm*—H. Donald Nelson

[57] ABSTRACT

A projection exposure system, which is used to transfer a pattern from a reticle or mask onto a substrate, incorporates a projection optical system that is capable of maintaining the same performance as that which can be found in an ideal environment, even when the actual use environment (e.g. atmospheric pressure and temperature) is not ideal. In addition, the projection optical system is able to recover the same performance as in an ideal environment through relatively minor adjustment of its projection optical system even when atmospheric pressure significantly changes due to, e.g., a change in location and altitude where the system is used.

10 Claims, 22 Drawing Sheets

138.90 MM

Position: 1
Scale: 0.18

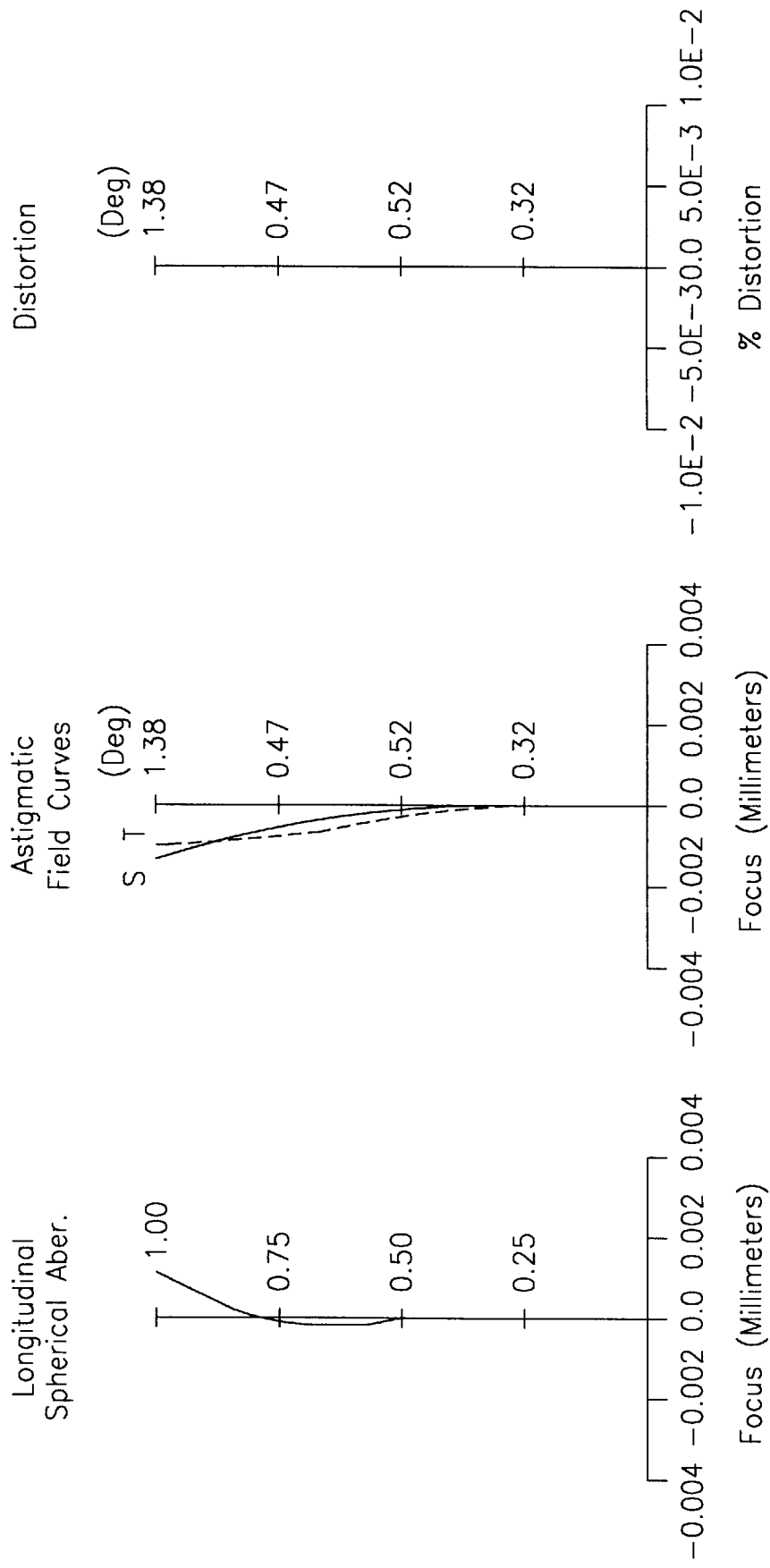

Ray Aberrations (Millimeters) ——— 365.0 NM

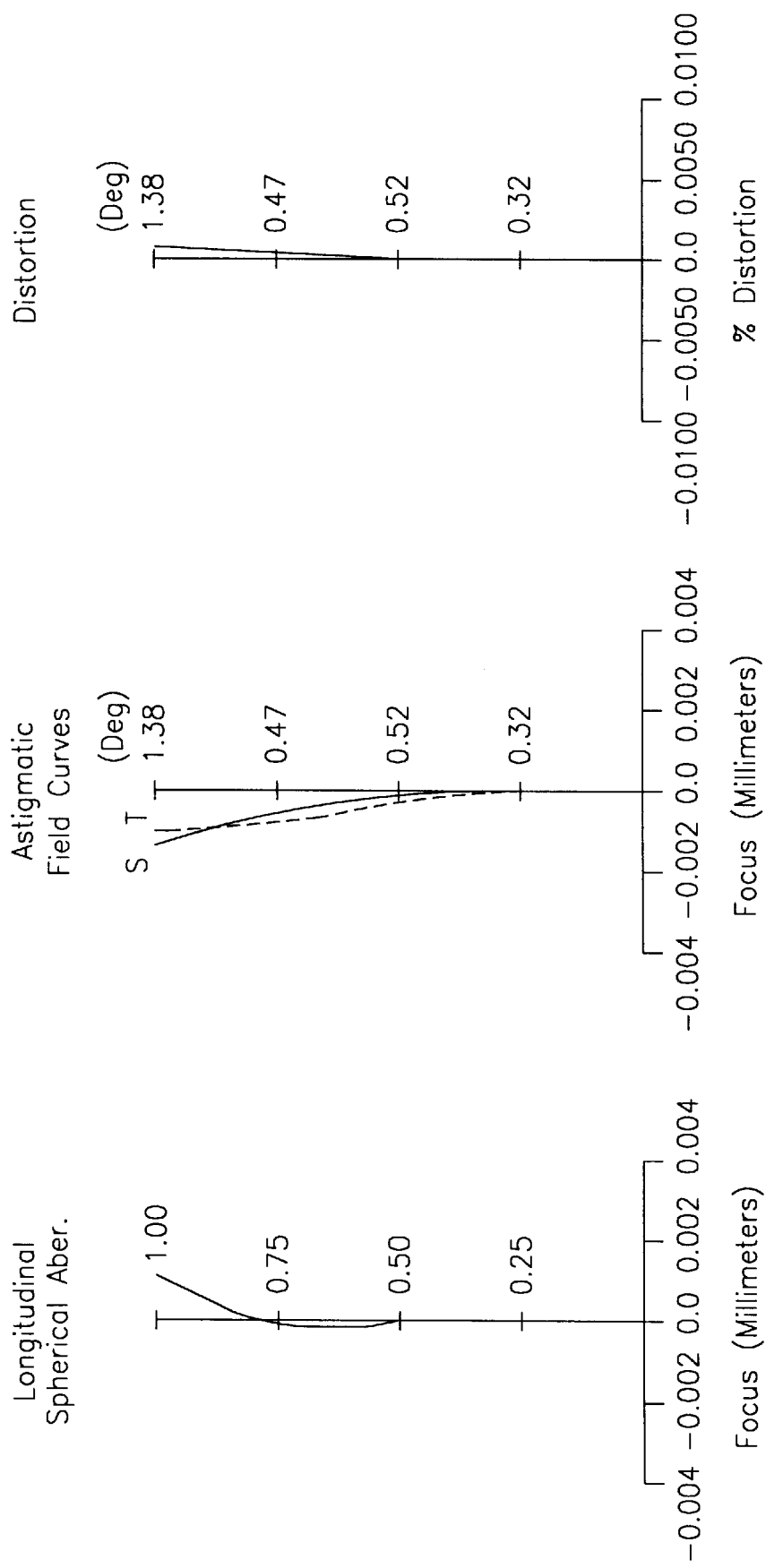

Ray Aberrations (Millimeters) —— 400.0 NM

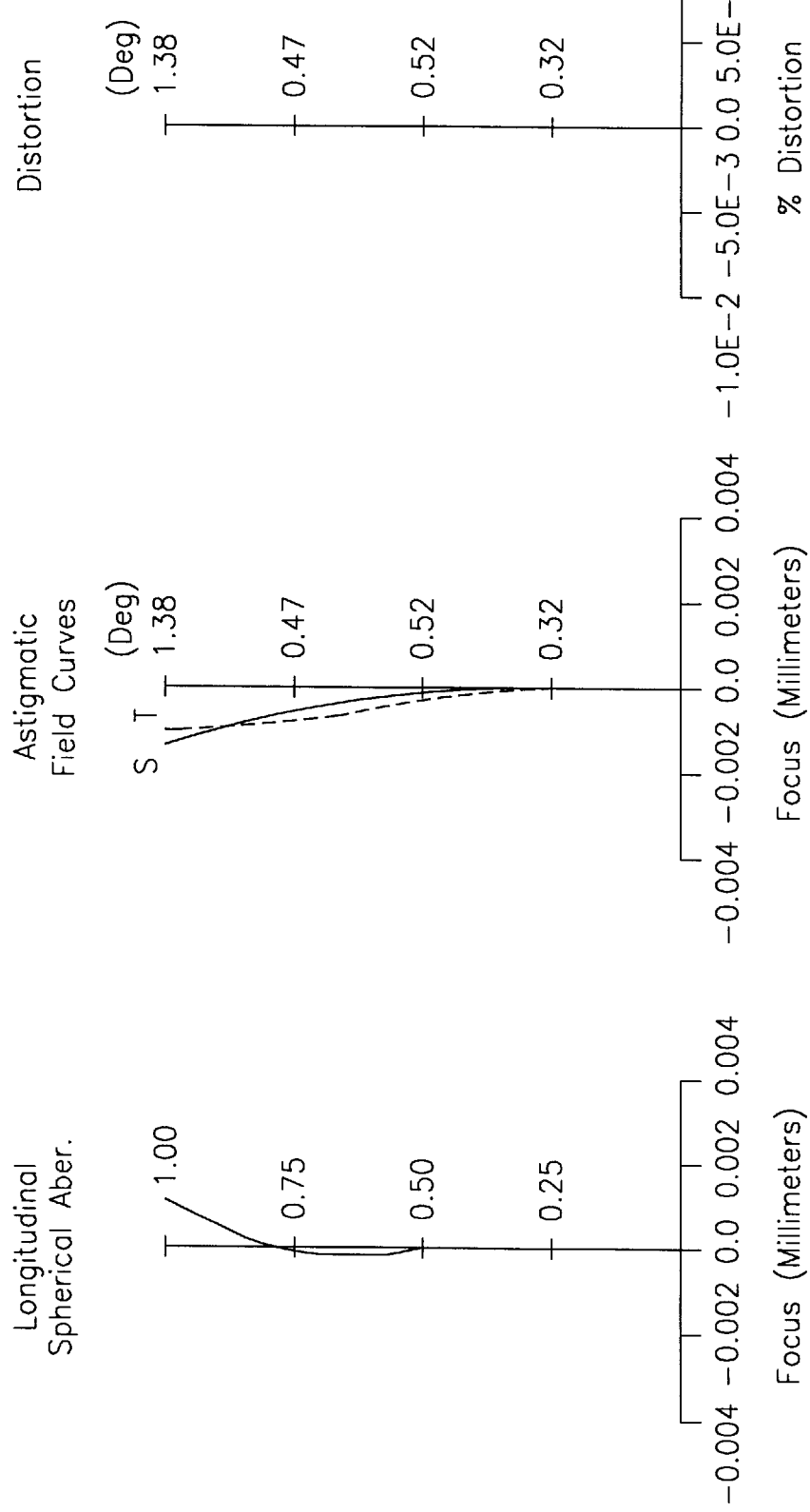

Ray Aberrations (Millimeters) —— 300.0 NM

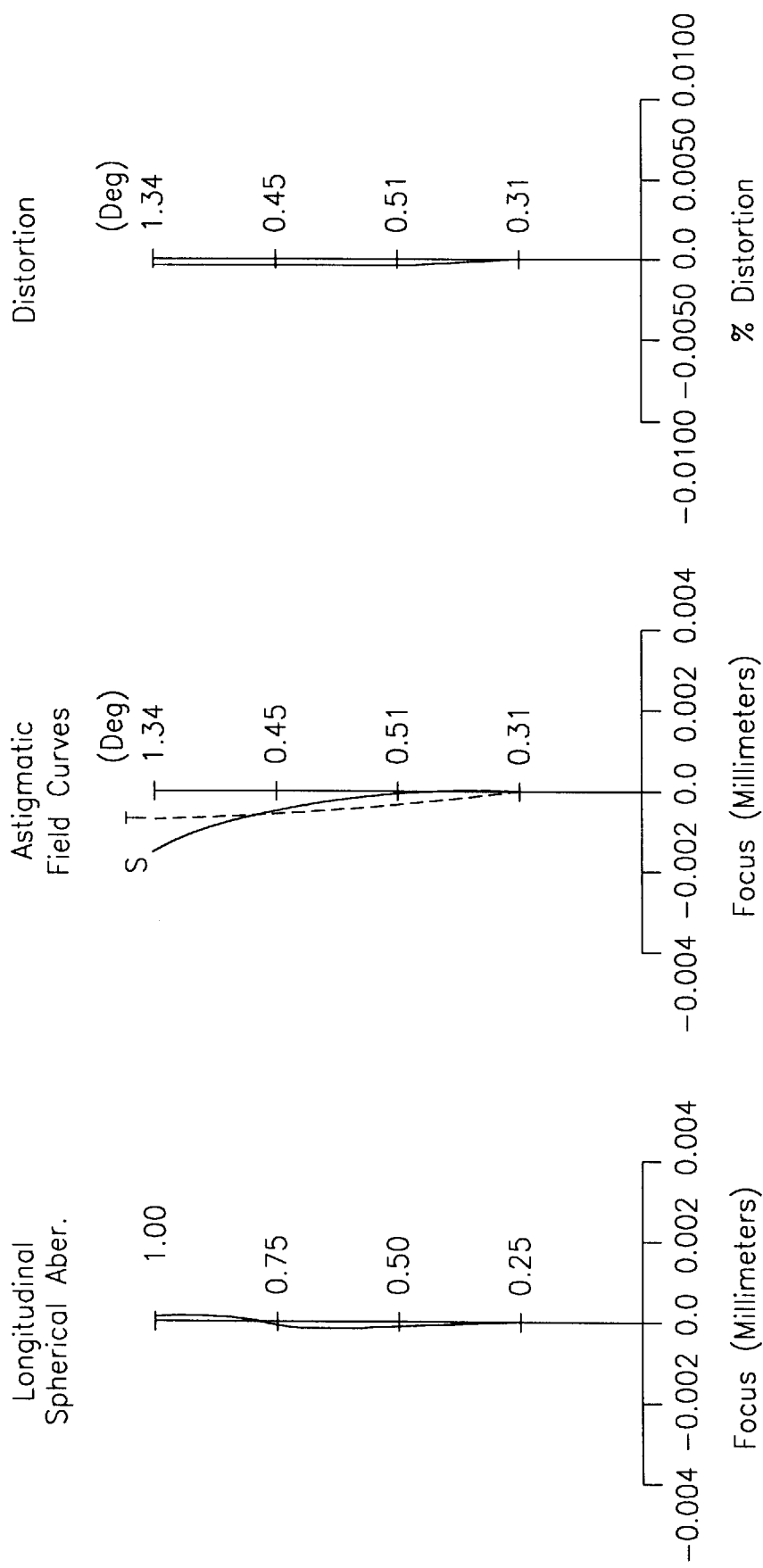

Ray Aberrations (Millimeters) ——— 365.0 NM

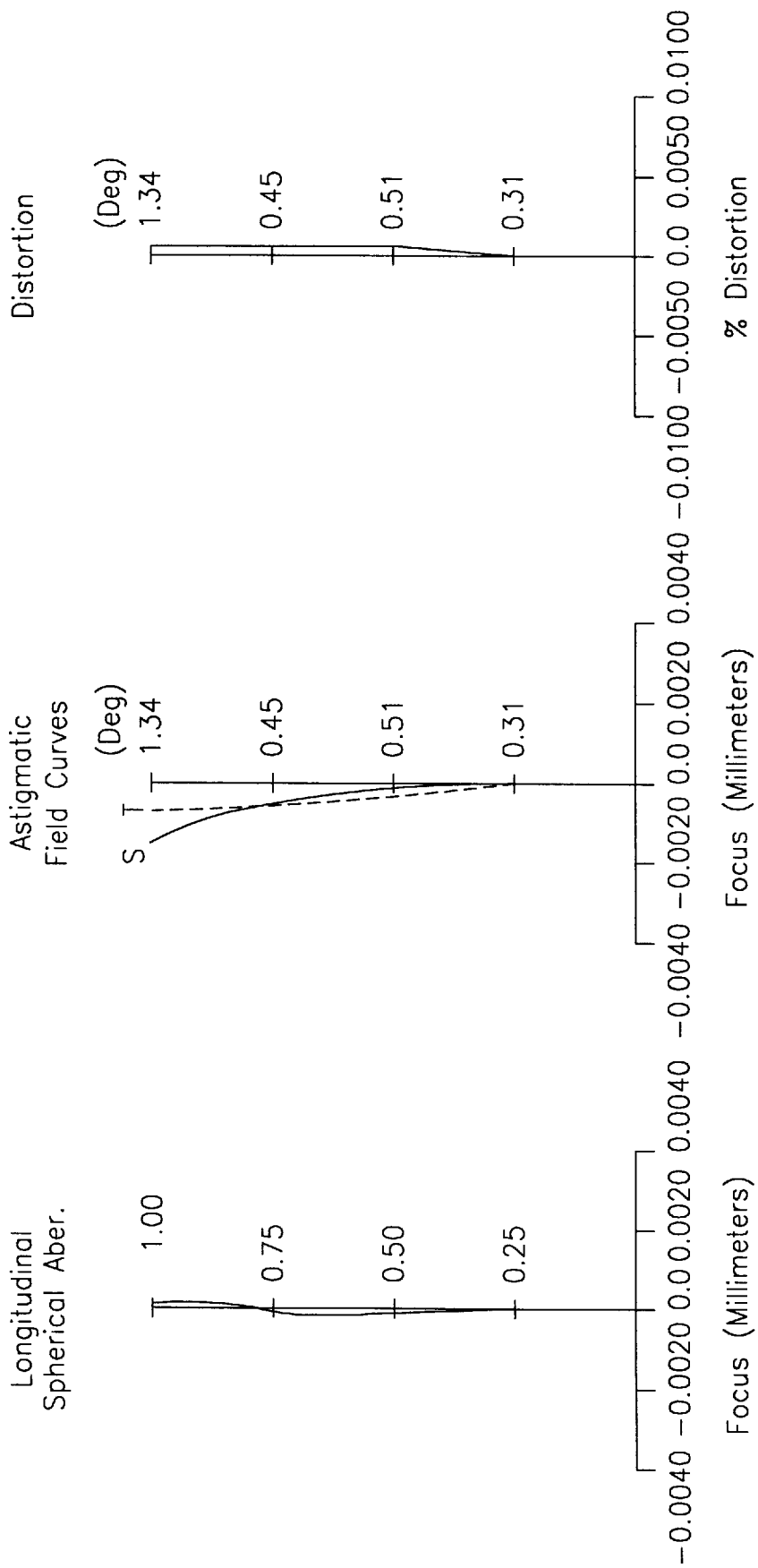

Ray Aberrations (Millimeters) ——— 365.0 NM

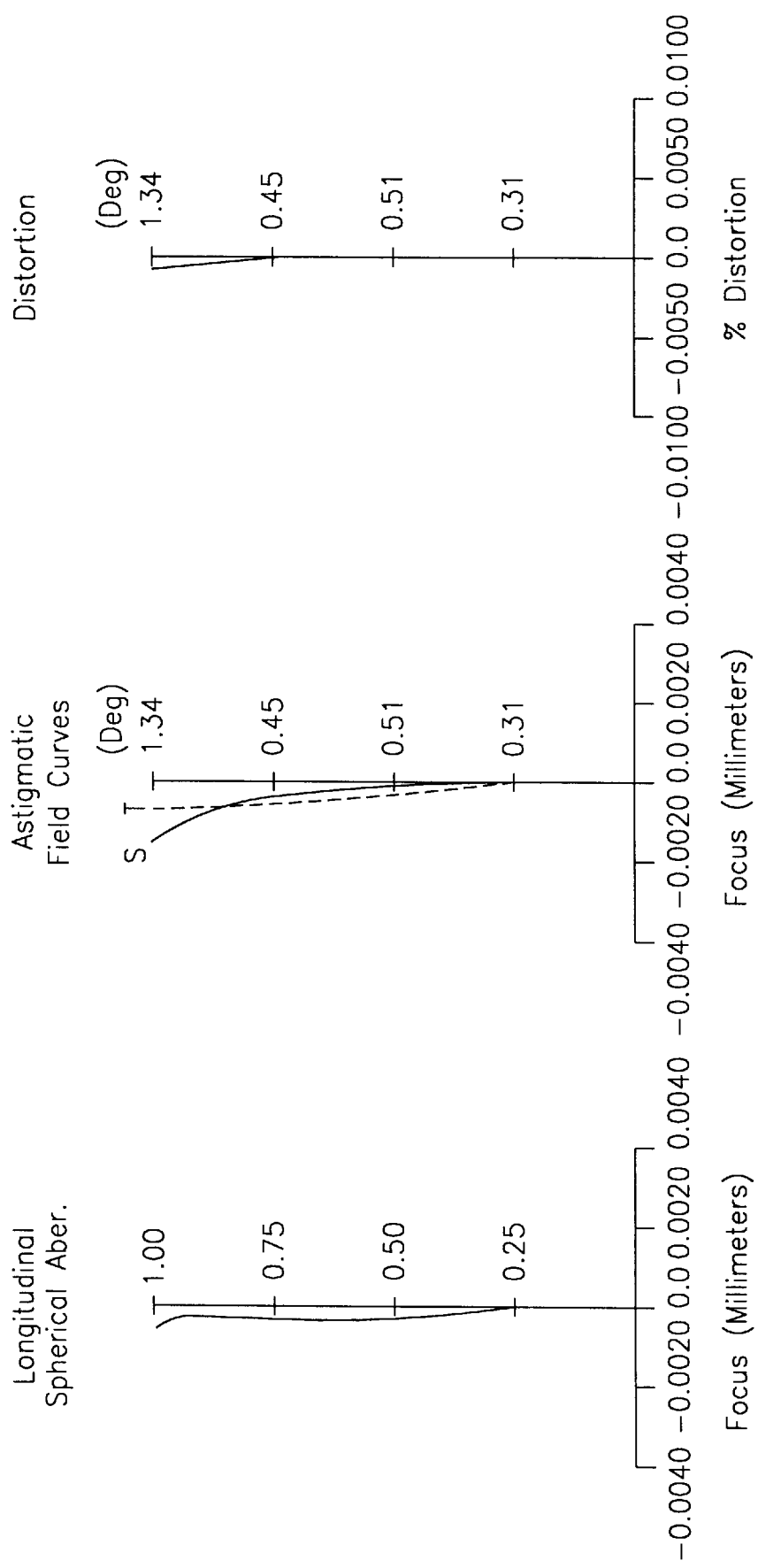

Ray Aberrations (Millimeters) ——— 365.0 NM of the maximum numerical aperture ray of the projection optical system when the surrounding atmospheric pressure of the projection optical system changes by 30 mmHg,

PROJECTION EXPOSURE METHOD AND APPARATUS

This application is a divisional application of application Ser. No. 08/724,167 filed Sep. 30, 1996 now U.S. Pat. No. 5,822,044.

1. FIELD OF THE INVENTION

This invention relates to a method and apparatus for transferring a pattern formed on a mask or reticle onto a substrate such as a semiconductor wafer or glass plate. More particularly, the present invention is directed to a projection exposure method and apparatus which uses a projection optical system to transfer the patterns formed on a mask or reticle onto another surface, for example a semiconductor wafer or glass plate, with the projection optical system capable of performance as if in an ideal (e.g. atmospheric pressure and temperature) environment when the actual environment in which the apparatus is used is not ideal.

2. BACKGROUND OF THE INVENTION

As integrated circuits (ICs) have become finer and more sophisticated, projection exposure apparatus to transfer circuit patterns onto semiconductor wafers or other receptive substrates (e.g. glass plates, etc.) have been required to perform at higher and higher resolutions. Particularly in recent years, systems have been required to perform well not only in an ideal environment but to do so even when the surrounding conditions change.

Although current projection exposure systems perform satisfactorily in an ideal environment, such systems typically do not do as well when conditions such as atmospheric pressure and temperature surrounding the projection optical system in the projection exposure system change. In conventional projection exposure systems, magnification errors due to changes in atmospheric pressure are corrected by controlling the air pressure of the medium which fills the gaps between the multiple optical members comprising the projection optical system. However, this corrective measure merely corrects for magnification abnormalities. The deterioration of other imaging performances is merely reduced to an amount where it is not considered a problem in a practical application of the device, with the practical application of the device being defined by the performance guaranteed atmospheric pressure range (the range for which system's operating performance is guaranteed). As for changes caused by deviations in temperature, various temperature controlling devices are known which are used to control the temperature of projection optical system. These devices essentially maintain the temperature of the system at sufficiently close to that of an ideal environment, so the performance required from such conventional systems can be obtained.

However, in recent years, such methods to correct for atmospheric pressure changes have become unsuitable for the needs of the users of such exposure systems who are trying to produce the aforementioned finer and more complicated circuit patterns. The greater densities being called for by semiconductor manufacturers are requiring higher resolutions from such projection exposure systems. This, in turn, requires a narrowing in the performance guaranteed atmospheric pressure range to sufficiently satisfy the rigorous performance being called for by the users of these projection exposure systems. Further, recent calls for higher resolution and more rigorous performance from such systems have also resulted in a need for stricter temperature control in such systems.

Differences in atmospheric pressure are inevitable due to changes in the altitude, etc. This is due in part to the fact that the manufacturing site of a projection optical system and the location where the projection exposure apparatus into which the optical system is incorporated are not the same. Conventionally, a projection optical system is adjusted until it achieves ideal imaging performance at the manufacturing site. The optical system is then further adjusted at the location of the actual use according to atmospheric conditions, e.g., altitude, in order to obtain the same ideal imaging performance at the use site. This adjustment is typically accomplished by, for example, changing the multiple air gaps within the projection optical system, or exchanging one lens element for another having a slightly different curvature radius, and so forth. Therefore, when the place where the projection optical system is used changes (e.g. different altitude), a significant readjustment of the projection optical system is necessary, resulting in disassembly and re-assembly of the projection optical system. As for temperature control, it is necessary to set the environmental temperature for each actual use site before manufacturing with the projection optical system.

Accordingly, there is a need for a projection optical system which is capable of maintaining the performance of an ideal environment, even when the actual use environment differs substantially from the ideal environment. Further, there is a need for a projection optical system which is capable of adapting to the environment in which it is used with relatively minor adjustments to the projection optical system.

3. SUMMARY OF THE INVENTION

The present invention solves the above and other problems associated with conventional projection optical systems by maintaining the same performance as in an ideal environment (in terms of atmospheric pressure and temperature) even when the environment changes. In addition, a projection optical system in accordance with the present invention is able to recover the same performance as in an ideal environment through relatively minor adjustment of its projection optical system even when atmospheric pressure significantly changes due to, e.g., a change in location and altitude where the system is used.

The above and other objects and advantages of the present invention are attained through a projection exposure apparatus according to one embodiment of the present invention in which specified patterns formed on reticle are transferred onto a substrate. A projection exposure apparatus according to this embodiment of the invention may include an illumination optical system to uniformly illuminate the reticle with a wavelength λ. A first supporting member is included which supports the reticle, and a second supporting member supports the substrate. A projection optical system is disposed between the reticle and the substrate. The projection optical system projects the patterns on reticle onto the substrate with ray bundle having a numerical aperture of at least 0.55 and which satisfies the following conditions:

$$|dSAp| < 0.3 \times \lambda / (NA)^2$$

$$|dCOMAp| < 0.3 \times \lambda / (NA),$$

where, dSAp is an amount of change in spherical aberration of the maximum numerical aperture ray of the projection optical system when the surrounding atmospheric pressure of the projection optical system changes by 30 mmHg, dCOMAp is an amount of change in coma aberration of the maximum numerical aperture ray at the maximum image height of the projection optical system when the surrounding atmospheric pressure of the projection optical system changes by 30 mmHg, and NA is a maximum numerical aperture of the projection optical system.

Also in order to attain above mentioned objectives and advantages of the present invention, a projection exposure apparatus of another embodiment of this invention which transfers specified patterns formed on a reticle onto a substrate includes an illumination optical system to uniformly illuminate the reticle with a wavelength λ, a first supporting member to support the reticle, a second supporting member to support the substrate, and a projection optical system disposed between the reticle and the substrate, which projects patterns on the reticle onto the substrate with ray bundle having an NA of at least 0.55, and which satisfies the following conditions:

$$|dSAt|<0.3\times\lambda/(NA)^2$$

$$|dCOMAt|<0.3\times\lambda/(NA)$$

$$|dMt|<0.2\times\lambda/(NA)^2$$

$$|dYt|<0.05\times\lambda/(NA),$$

where, dSAt is an amount of change in spherical aberration of the maximum numerical aperture ray of the projection optical system when the surrounding temperature of the projection optical system changes by 3° C., dCOMAt is an amount of change in coma aberration by the maximum numerical aperture ray at the maximum image height of the projection optical system when the surrounding temperature of said projection optical system changes by 3° C., dMt is an amount of change in field curvature at the maximum image height of the projection optical system when the surrounding temperature of the projection optical system changes by 3° C., dYt is an amount of change in image height at the maximum image height of the projection optical system when the surrounding temperature of said projection optical system changes by 3° C., and NA is the maximum numerical aperture of the projection optical system.

In another embodiment, the projection optical system according to this invention projects an image of first object onto a second object, and includes, from the side of the first object, a first lens group having a positive refractive power, a second lens group having a negative refractive power, a third lens group having a positive refractive power, a fourth lens group having a negative refractive power, a fifth lens group having a positive refractive power and an aperture stop placed within the fifth lens group. In this embodiment, the third lens group includes first and second meniscus lens elements having a positive refractive power with the concave surface directed to the first object side and third and fourth meniscus lens elements having a positive refractive power with the concave surface directed to the second object side. The lens element having the maximum effective diameter among the lens elements comprising the third lens group is placed between the first and fourth meniscus lens elements.

In still another embodiment of a projection optical system according to the present invention in which an image of a first object is projected onto a second object, the projection optical system includes, from the side of the first object, a first lens group having a positive refractive power; a second lens group having a negative refractive power; a third lens group having a positive refractive power; a fourth lens group having a negative refractive power; a fifth lens group having a positive refractive power, and an aperture stop placed within the fifth lens group. In accordance with this embodiment, the fifth lens group has first and second air-spaced doublets comprising a positive lens element and a negative lens element, where the first and second air-spaced doublets are placed on the side closer to the second object from the aperture stop and at least one lens element comprising the first and second air-spaced doublets has the maximum effective diameter among the fifth lens group.

These and other advantages of the present invention will become more apparent upon a reading of the detailed description of the preferred embodiments which follows, when considered in conjunction with the drawings of which the following is a brief description. It should be clear that the drawings are merely illustrative of the currently preferred embodiments of the present invention, and that the invention is in no way limited to the illustrated embodiments. The present invention is best defined by the claims appended to this specification.

4. BRIEF DESCRIPTION OF THE DRAWINGS

FIGS. 9A–9D illustrate in graphical form longitudinal spherical aberrations, astigmatic field curves, distortion and ray aberrations in millimeters of the first embodiment under ideal conditions.

FIGS. 10A–10D illustrate in graphical form the aberrations illustrated in FIGS. 9A–9D, respectively, when atmospheric pressure changes by −30 mmHg.

FIGS. 11A–11D illustrate in graphical form the aberrations illustrated in FIGS. 9A–9D, respectively when the temperature changes by −3° C. from ideal conditions.

FIGS. 14A–14D illustrate in graphical form longitudinal spherical aberrations, astigmatic field curves, distortion and ray aberrations in millimeters of the first embodiment under ideal conditions FIGS. 15A–15D illustrate in graphical form the aberrations illustrated in FIGS. 14A–14D, respectively, when atmospheric pressure changes by −30 mmHg.

FIGS. 16A–16D illustrate in graphical form the aberrations illustrated in FIGS. 14A–14D, respectively when the temperature changes by −3° C. from ideal conditions.

5. DESCRIPTION OF THE PREFERRED EMBODIMENTS

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Figure 1:
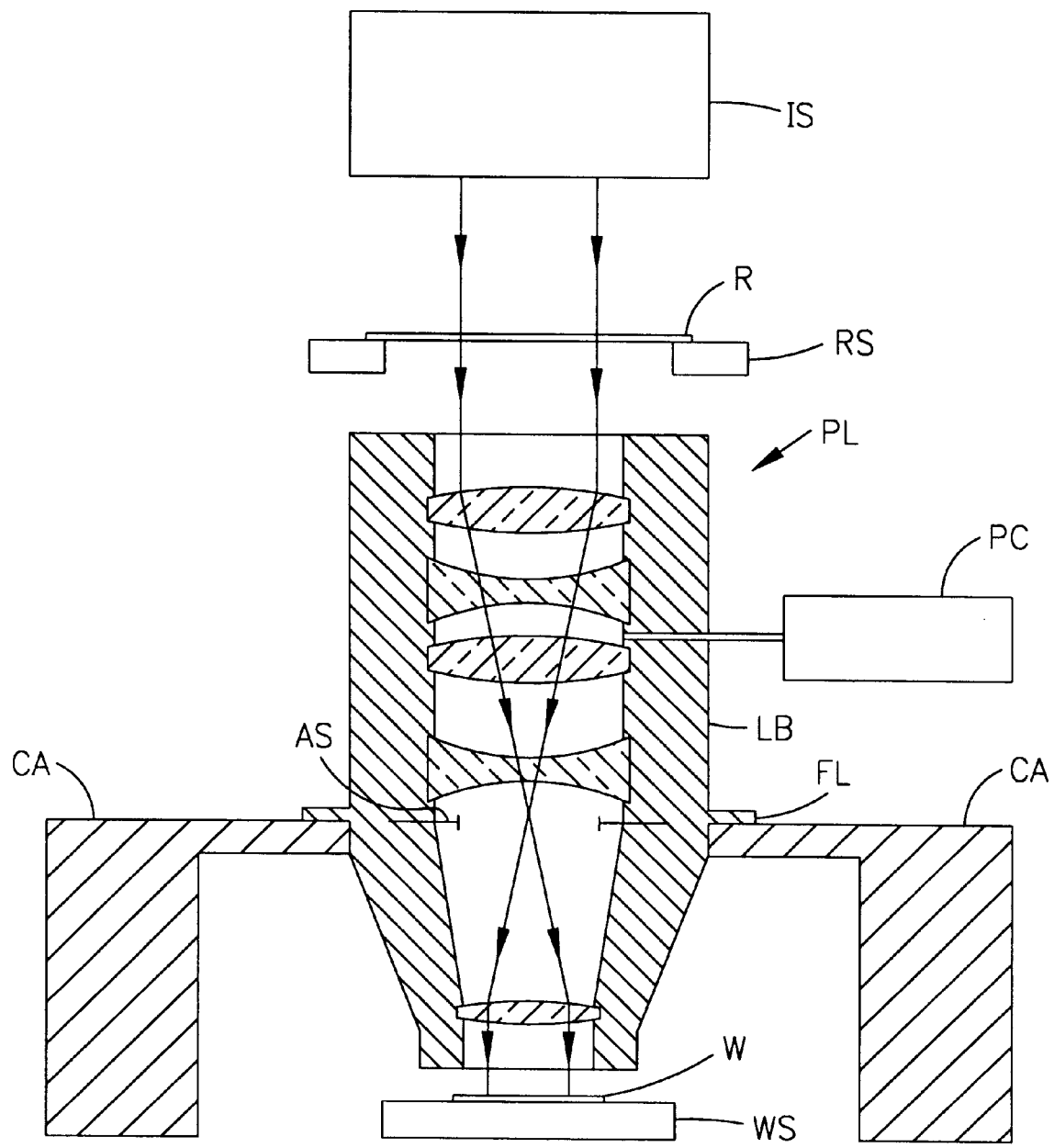
FIG. 1 is a schematic diagram of an embodiment of a projection optical system according to the invention as used in an exposure system.

Referring to FIG. 1, an illumination optical system IS includes a high pressure mercury lamp and uniformly illuminates reticle R with illumination light of i-line wavelength (365 nm). Examples of such an illumination optical system which may be used can be found in, for example, U.S. Pat. Nos.: 4,497,015, 4,918,583, 5,245,384, 5,335,044 and 5,420,417. Each of these patents is incorporated herein by reference in its entirety.

Reticle R has specified circuit patterns formed on the surface and is supported on reticle stage RS. Below the reticle R, wafer W is placed on, and supported by, wafer stage WS. The light from reticle R illuminated by illumination optical system IS enters projection optical system PL, then forms the image of light source within illumination optical system IS at pupil position (the position of the aperture stop) of the projection optical system PL. That is, the illumination optical system IS uniformly illuminates reticle R under the Kohler illumination. The light from the pupil position of the projection optical system PL is emitted from the projection optical system and reaches wafer W as the second object. The projection optical system PL forms the image of the reticle R on this wafer W. Thus, circuit pattern of reticle R is transferred onto wafer W.

The projection optical system PL comprises multiple lens elements. These lens elements are supported inside a lens barrel LB in such a way that specified amounts of air gaps are kept in between them. Flange FL is provided outside of the lens barrel LB. The flange FL is supported by carriage CA of the main body of the projection exposure apparatus. Pressure control equipment PC is provided in the projection optical system PL to control the pressure of certain air gaps among those between lens elements. With respect to the pressure control equipment PC, U.S. Pat. No. 4,666,273, which patent is incorporated herein by reference in its entirety, discloses pressure control equipment which can be used with the present invention.

The projection optical system PL in the projection exposure apparatus shown in FIG. 1 is structured so as to satisfy the following conditions:

$$|dSAp| < 0.3 \times \lambda/(NA)^2 \qquad (1)$$

$$|dCOMAp| < 0.3 \times \lambda/(NA), \qquad (2)$$

where, dSAp is an amount of change in spherical aberration of the maximum numerical aperture ray of the projection optical system PL when surrounding atmospheric pressure of the projection optical system changes by 30 mmHg;

dCOMAp is an amount of change in coma aberration of the maximum numerical aperture ray at the maximum image height of-the projection optical system PL when surrounding atmospheric pressure of the projection optical system changes by 30 mmHg, and NA is the maximum numerical aperture of the projection optical system PL.

The above conditions (1) and (2) are both conditions to make the contrast of reticle R image formed by the projection optical system PL favorable. The condition (1) determines the relation between the depth of focus of the projection optical system and the amount of change in spherical aberration which can be allowed as the projection optical system when atmospheric pressure changes. It is undesirable not to have the condition (1) satisfied because, if not, the amount of generated spherical aberration becomes excessively large and MTF of image declines, rendering the image contrast to deteriorate. The condition (2) determines the relation between the resolving power of the projection optical system and the amount of change in coma aberration which can be allowed as the projection optical system when atmospheric pressure changes. It is undesirable not to have the condition (2) satisfied because, if not, the amount of generated coma aberration around the image becomes excessively large and MTF in the surrounding area of the image declines, rendering the image contrast of the area to deteriorate.

In projection exposure apparatus such as this embodiment, it is deemed that there is eventually no deterioration of performance due to the change in atmospheric pressure for illumination optical system IS, reticle stage RS and wafer stage WS. Therefore, in this embodiment, deterioration of image contrast is actually prevented by using the projection optical system satisfying above conditions (1) and (2), even if the atmospheric pressure changes. Having this structure, this embodiment makes it possible to transfer patterns of reticle R onto wafer W with excellent imaging performance even when the atmospheric pressure changes.

Also, the projection optical system in the projection exposure apparatus shown in FIG. 1 is structured so as to satisfy the following conditions:

$$|dSAt| < 0.3 \times \lambda/(NA)^2 \qquad (3)$$

$$|dCOMAt| < 0.3 \times \lambda/(NA) \qquad (4)$$

$$|dMt| < 0.2 \times \lambda/(NA)^2 \qquad (5)$$

$$|dYt| < 0.05 \times \lambda/(NA), \qquad (6)$$

where, dSAt is an amount of change in spherical aberration of the maximum numerical aperture ray of the projection optical system PL when the surrounding temperature of the projection optical system changes by 3° C., dCOMAt is an amount of change in coma aberration of the maximum numerical aperture ray at the maximum image height of the projection optical system PL when the surrounding temperature of the projection optical system changes by 3° C., dMt is an amount of change in field curvature at the maximum image height of the projection optical system PL when the surrounding temperature of the projection optical system PL changes by 3° C., dYt is an amount of change in image height at the maximum image height of the projection optical system PL when the surrounding temperature of the projection optical system PL changes by 3° C. and NA is the maximum numerical aperture of the projection optical system PL.

The above conditions (3) to (6), inclusive, are the conditions to maintain image contrast of reticle R formed by the projection optical system PL, field curvature and image magnification in favorable status. The condition (3) determines the relation between the depth of focus of the projection optical system and the amount of change in spherical aberration which can be allowed as the projection optical system PL when temperature changes. It is undesirable not to have the condition (3) satisfied because, if not, the amount of spherical aberration generated when the surrounding atmospheric temperature of the projection optical system PL changes becomes excessively large, then MTF of image declines, rendering the image contrast to deteriorate. The condition (4) determines the relation between the resolving power of a projection optical system PL and the amount of change in coma aberration which can be allowed as a projection optical system PL when temperature changes. It is undesirable not to have the condition (4) satisfied because, if not, the amount of coma aberration around image generated when the surrounding atmospheric temperature of the projection optical system PL changes becomes excessively large, then MTF around image declines, rendering image contrast at the surrounding area to deteriorate. The condition (5) determines the relation between the depth of focus of the projection optical system PL and change in field curvature which can be allowed as the projection optical system PL when temperature changes. It is undesirable not to have the condition (5) satisfied because, if not, the amount of field curvature generated when the atmospheric temperature surrounding projection optical system PL changes becomes excessively large, then the usable depth of focus becomes too shallow. The condition (6) determines the relation between the resolving power of the projection optical system PL and change in image height which can be allowed as the projection optical system PL when the temperature changes. It is undesirable not to have the condition (6) satisfied because, if not, change of image height generated when the atmospheric temperature surrounding the projection optical system PL becomes excessively large, rendering a magnification error.

It is deemed that, in projection exposure apparatus such as this embodiment, there is eventually no deterioration of performance due to change of temperature for illumination optical system IS, reticle stage RS and wafer stage WS. Therefore, in the (systems) of this embodiment, change in imaging performance is practically restricted by using the projection optical system PL satisfying above conditions (1) to (6) inclusive. This embodiment structure makes it possible to transfer patterns on reticle R onto wafer W with excellent imaging performance even when temperature changes.

Figure 2:
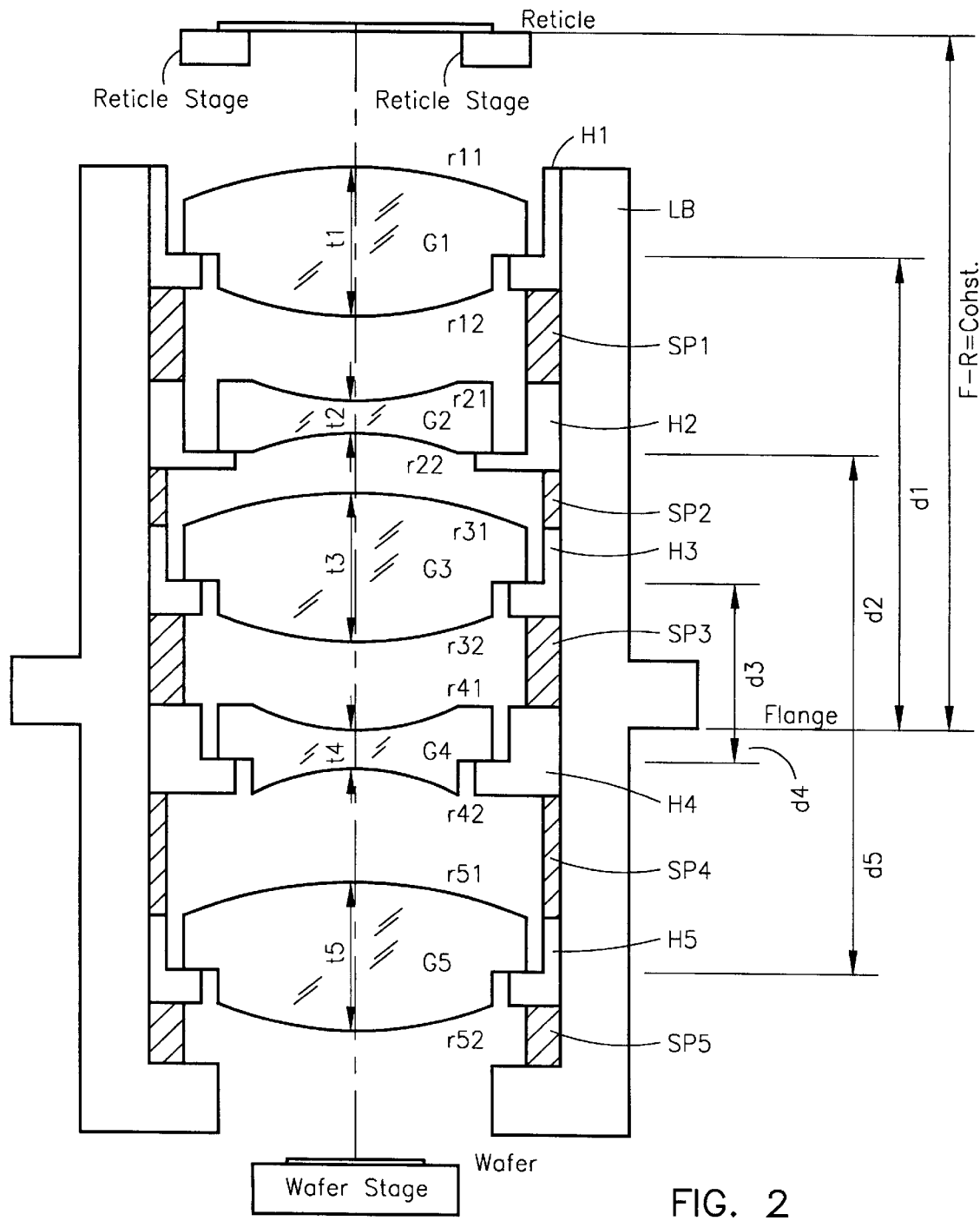
FIG. 2 is a schematic cross section showing an example of a lens barrel of a projection exposure apparatus incorporating a projection optical system according to the present invention.

Following is the description of the lens element supporting method according to this embodiment referring to FIG. 2. FIG. 2 is a cross section of a projection optical system PL, where lens elements comprising the projection optical system are roughly divided into five lens elements G1 to G5, for the sake of simplicity.

In FIG. 2, each lens element G1 to G5 is placed on supporting members H1 to H5 respectively. The supporting members H1 to H5 having a ring shape support each lens element G1 to G5 by their peripheral area. Between each supporting member H1 to H5, spacers SP1 to SP5 having a ring shape to maintain specified distances between each lens element G1 to G5 are placed, where thickness of each spacer SP1 to SP5 in the direction of optical axis is determined so that the desired distance values between lens elements G1 to G5 are maintained.

In this embodiment structure, the lens barrel LB, the supporting members H1 to H5 and the spacers SP1 to SP5 are all made of the same material. This structure prevents a distortion caused by different thermal expansion coefficients which would have been generated if the lens barrel, supporting members and spacers were made of a variety of materials.

The projection optical system PL shown in FIG. 1 is structured so as to satisfy the following conditions:

$$|dSAt1| < 0.9 \times \lambda/(NA)^2 \tag{7}$$

$$|dSAt2| < 0.9 \times \lambda/(NA)^2 \tag{8}$$

$$|dSAt3| < 0.9 \times \lambda/(NA)^2 \tag{9}$$

$$|dCOMAt1| < 0.9 \times \lambda/(NA) \tag{10}$$

$$|dCOMAt2| < 0.9 \times \lambda/(NA) \tag{11}$$

$$|dCOMAt3| < 0.9 \times \lambda/(NA) \tag{12}$$

$$|dMt1| < 0.6 \times \lambda/(NA)^2 \tag{13}$$

$$|dMt2| < 0.6 \times \lambda/(NA)^2 \tag{14}$$

$$|dMt3| < 0.6 \times \lambda/(NA)^2 \tag{15}$$

$$|dYt1| < 0.15 \times \lambda/(NA) \tag{16}$$

$$|dYt2| < 0.15 \times \lambda/(NA) \tag{17}$$

$$|dYt3| < 0.15 \times \lambda/(NA), \tag{18}$$

where, dSAt1 is an amount of change in spherical aberration of the maximum numerical aperture ray of the projection optical system PL generated according to the change in refractive index of the optical members comprising lens element when the temperature of the projection optical system PL changes by 3° C., dSAt2 is an amount of change in spherical aberration of the maximum numerical aperture ray of the projection optical system PL generated according to the change in the shape of optical members comprising lens element when the temperature of the projection optical system PL changes by 3° C., dSAt3 is an amount of change in spherical aberration of the maximum numerical aperture ray of the projection optical system PL generated according to the expansion and contraction of the lens barrel supporting lens elements when the temperature of the projection optical system PL changes by 3° C., dCOMAt1 is an amount of change in coma aberration of the maximum numerical aperture ray at the maximum image height of the projection optical system PL generated according to the change in refractive index of the optical members comprising lens element when the temperature of the projection optical system PL changes by 3° C., dCOMAt2 is an amount of change in coma aberration of the maximum numerical aperture ray at the maximum image height of the projection optical system PL generated according to the change in shape of the optical members comprising lens element when the temperature of the projection optical system PL changes by 3° C., dCOMAt3 is an amount of change in coma aberration of the maximum numerical aperture ray at the maximum image height of the projection optical system PL generated according to the expansion and contraction of the lens barrel which supports the lens elements when the temperature of the projection optical system PL changes by 3° C., dMt1 is an amount of change in field curvature at the maximum image height of the projection optical system PL generated by the change in the refractive index of the optical members comprising lens element when the temperature of the projection optical system PL changes by 3° C., dMt2 is an amount of change in field curvature at the maximum image height of the projection optical system PL generated by the change in shape of optical members comprising lens element when the temperature of the projection optical system PL changes by 3° C., dMt3 is an amount of change in field curvature at the maximum image height of the projection optical system PL generated by the expansion and contraction of the lens barrel supporting lens element when the temperature of the projection optical system PL changes by 3° C., dYt1 is an amount of change in image height at the maximum image height of the projection optical system PL generated by the change of the refractive index of the optical members comprising lens element when the temperature of the projection optical system PL changes by 3° C., dYt2 is an amount of change in image height at the maximum image height of the projection optical system PL generated by the change of shape of the optical members constituting lens element when the temperature of the projection optical system PL changes by 3° C., dYt3 is an amount of change in image height at the maximum image height of the projection optical system PL generated by the expansion and contraction of the optical members comprising the lens element when the temperature of the projection optical system PL changes by 3° C., $\lambda$ is a wavelength of illumination light from the illumination optical system, and NA is the maximum numerical aperture of the projection optical system PL.

The above conditions (7) to (18), inclusive, are the conditions to favorably maintain the reticle R image contrast formed by the projection optical system PL, field curvature and image magnification.

The conditions (7) to (9) correspond to above mentioned condition (3), where they provide that the amount of change in spherical aberration occurring due to the change of the refractive index caused by the temperature change of each lens element itself comprising the projection optical system PL, the amount of change in spherical aberration occurring due to the change of the shape caused by the temperature change of each lens element itself, and the amount of change in spherical aberration occurring due to the expansion and contraction caused by the temperature change of the lens barrel supporting each lens element are three times or less of the amount of change in spherical aberration that above mentioned condition (3) determines as allowable as a projection optical system PL.

The conditions (10) to (12) correspond to above mentioned condition (4), where they provide that the amount of change in coma aberration occurring due to the change of the refractive index caused by the temperature change of each lens unit itself comprising the projection optical system PL, the amount of change in coma aberration occurring due to the change in shape caused by the temperature change of each lens unit itself, and the amount of change in coma aberration occurring due to the expansion and contraction caused by the temperature change of the lens barrel supporting each lens element are three times or less of the amount of change in coma aberration that above mentioned condition (4) determines as allowable as a projection optical system PL.

The conditions (13) to (15) correspond to above mentioned condition (5), where they provide that the amount of change in field curvature occurring due to the change of the refractive index caused by the temperature change of each lens element itself comprising the projection optical system PL, the amount of change in field curvature occurring due to the change of shape caused by the temperature change of each lens element itself, and the amount of change in field curvature occurring due to the expansion and contraction caused by the temperature change of the lens barrel supporting each lens element are three times or less of the amount of change of field curvature that above mentioned condition (5) determines as allowable as a projection optical system PL.

The conditions (16) to (18) correspond to above mentioned condition (6), where they provide that the amount of change in image height occurring due to the change of refractive index caused by the temperature change of each lens element itself comprising the projection optical system PL, the amount of change in image height occurring due to the change of shape caused by the temperature change of each lens element itself, and the amount of change in image height occurring due to the expansion and contraction caused by the temperature change of the lens barrel supporting the lens element, are three times or less of the amount of change of image height that above mentioned condition (6) determines as allowable as a projection optical system PL.

Thus, the conditions (7) to (18) inclusive provide that the amount of change in aberration due to the change in refractive index of each lens element, the change in shape of each lens element and the expansion and contraction of the lens barrel are three times or less of the amount of change in aberrations as the total of these parameters (change in refractive index, change in shape and the expansion and contraction of the lens barrel). This structure makes it possible to keep the discrepancy between the amount of change of each aberration caused by the temperature change and the expected values to a minimum, even when there is difference between the values used in designing and the actual value in each parameter. This structure is especially effective when the refractive indexes are different because the glass lots comprising lens element are different, or when there is an error in measuring refractive indexes of glasses.

In above mentioned example, the supporting members H1 to H5 which support each lens element G1 to G5 of the projection optical system PL, the spacers SP1 to SP5 which keep specified distances between supporting members H1 to H5 and the lens barrel which contains these supporting members H1 to H5 and spacers SP1 to SP5 are all made of the same material; however, they do not have to be so. As long as the structure satisfies above conditions (1) to (18) inclusive, the supporting members H1 to H5 and the lens barrel LB can be made of the same material while the spacers are made of the different material, or the supporting members H1 to H5, the spacers SP1 to SP5 and the lens barrel LB can be all made of different materials.

Figure 3:
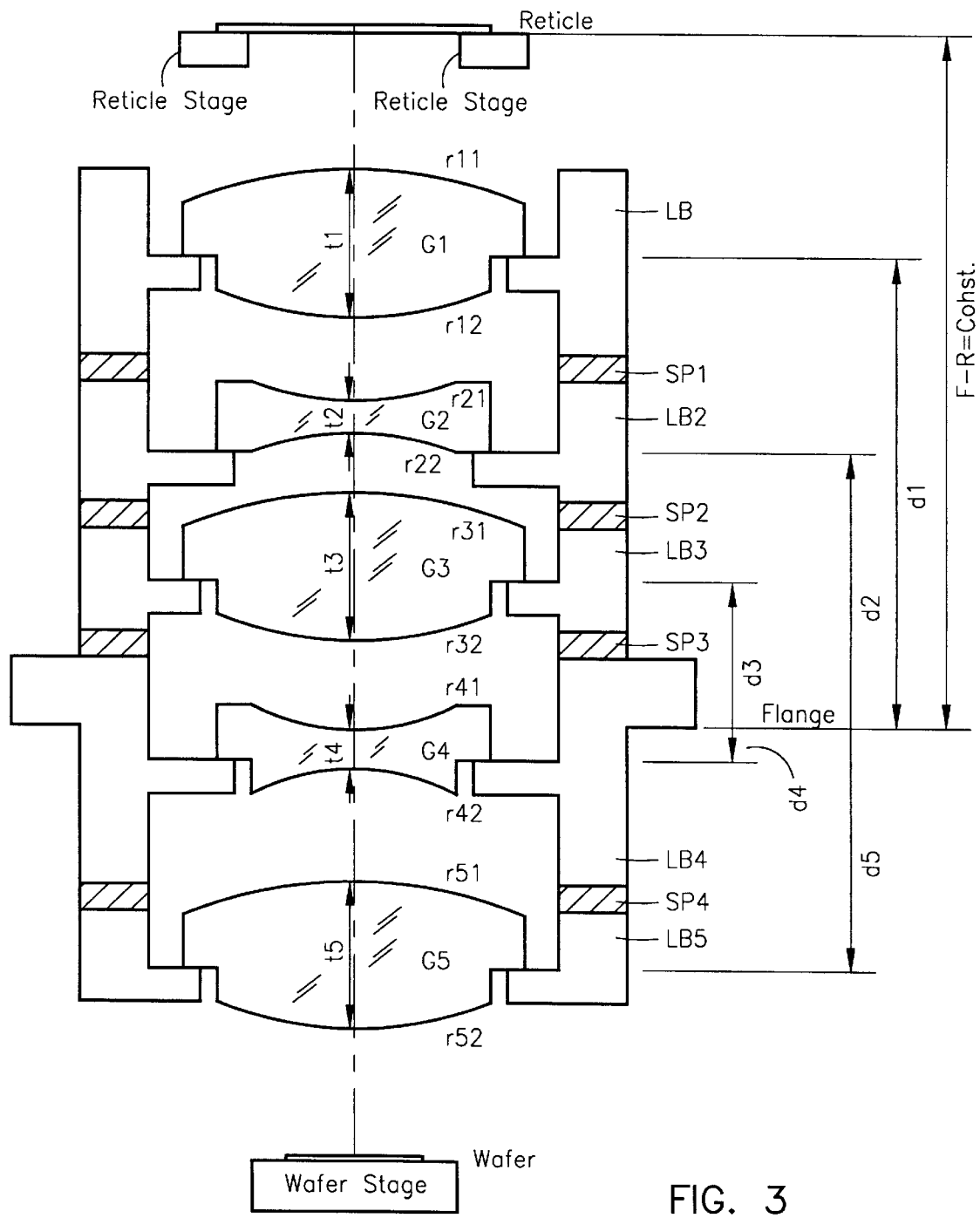
FIG. 3 is a schematic cross section showing another example of a lens barrel of a projection exposure apparatus incorporating a projection optical system according to the present invention.

The lens barrel can be comprised as shown in FIG. 3. FIG. 3 is a cross section showing another structure of a lens barrel. In FIG. 3 as well, the lens elements comprising the projection optical system PL are divided into five lens elements G1 to G5 for the sake of simplicity. In FIG. 3, each lens element G1 to G5 is placed on sub lens barrels LB1 to LB5 respectively. These sub lens barrels LB1 to LB5 are ring-shaped members, where there are shelving rings inside on which each lens element is placed. Between each sub lens barrel LB1 to LB5, spacers SP1 to SP5 are placed to maintain specified distances between each sub lens barrel LB1 to LB5 so that the gaps between each lens element G1 to G5 are kept at desired values. These spacers SP1 to SP5 have a ring shape, and their thickness are determined so that the distances between each lens element G1 to G5 become desired values. In the example of FIG. 3, the sub lens barrels LB1 to LB5 and spacers SP1 to SP5 are made of the same material, however, the sub lens barrels LB1 to LB5 and the spacers SP1 to SP5 can be made of the different materials. Of course, the example of FIG. 3 should have the structure to satisfy said conditions (1) to (18).

Figure 4:
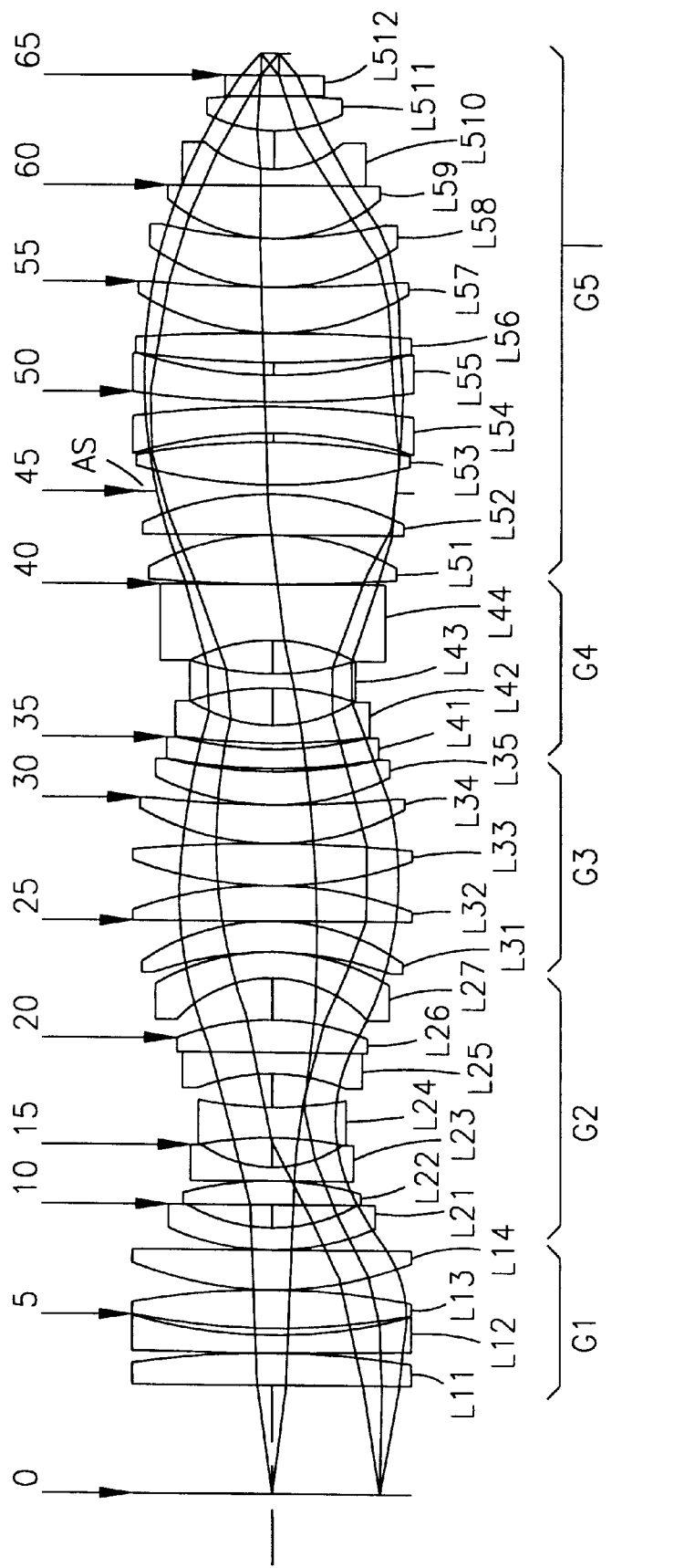
FIG. 4 is a schematic diagram of the lenses included in a first embodiment of a projection optical system according to this invention.

FIG. 4 is a diagram to show optical paths of the projection optical system PL according to the first embodiment. In FIG. 4, the projection optical system PL according to the first embodiment has, from the side of reticle R as the first object, a first lens group G1 having a positive refractive power, a second lens group G2 having a negative refractive power, a third lens group G3 having a positive refractive power, a fourth lens group having a negative refractive power and a fifth lens group G5 having a positive refractive power; wherein, the third lens group G3 is structured to include, from the side of reticle R, the first and second meniscus lenses L31 and L32 having a positive refractive power and the concave surface directed to the side of reticle R, and the third and fourth meniscus lenses L34 and L35 having a positive refractive power and the concave surface directed to the side of wafer W. In this embodiment, the lens element L33 with the largest effective diameter among the third lens group G3 is placed between the first meniscus lens L31 and the fourth meniscus lens L35.

The fifth lens group G5 is structured to have an aperture stop AP within; on the side of wafer W from the aperture stop AP placed is the first air-spaced doublet comprising of a negative meniscus lens L53 with the concave surface directed to the wafer and a double convex positive lens L54, and the second air-spaced doublet comprising of a double convex positive lens L55 and a negative meniscus lens L56 with the concave surface directed to the side of reticle R.

Following is the explanation of the operation according to above mentioned structure. The role of each lens group G1 to G5 are as follows:

The first lens group G1 has a positive refractive power as a whole, and plays a role to correct astigmatism and distortion. The second lens group G2 has a negative refractive power as a whole, and helps reducing field curvature by having a negative Petzval sum while minimizing the generation of coma aberration and distortion. The third lens group G3 has a positive refractive power as a whole, and corrects negative coma aberration which occurs mainly in the latter half (i.e. the second object side) of the fourth lens group G4 and the fifth lens group G5. Also, the third lens group G3 plays a role to elongate the working distance of the wafer side in the projection optical system by comprising a retro focus system with its (−+) refractive power arrangement with the second lens group G2. The fourth lens group G4 has a negative refractive power as a whole and contributes significantly to the reduction of field curvature by having a negative Petzval sum. The fifth lens group G5 has a positive refractive power as a whole, condenses rays on the surface of the second object and forms image of an object while minimizing the generation of various aberrations as much as possible.

The projection optical system PL according to this embodiment has an arrangement of refractive powers (+−+−+) as a whole, where the lens groups with a positive refractive power and those with a negative refractive power are placed alternately. This structure makes it possible to correct the aberrations occurring at the lens groups having a positive refractive power by the adjacent lens groups having a negative refractive power, where aberrations are restricted under an ideal condition. In addition, when the environmental conditions such as atmospheric pressure and temperature change, it is possible to cancel the change of aberrations occurring at the lens groups having a positive refractive power by change of aberrations occurring at the adjacent lens groups having a negative refractive power.

In the projection optical system PL according to this embodiment, the first lens group G1, the second lens group G2 and the fifth lens group G5 are structured by combining positive lens elements and negative lens elements. This structure makes it possible to restrict aberrations under an ideal environment by correcting aberrations occurring at the positive lens elements by the negative lens elements, and also cancel aberration changes occurring at the positive lens elements by the negative lens elements when the environment such as atmospheric pressure and temperature change.

However, as the projection optical system PL has a positive refractive power as a whole, there is a tendency that the amount of change in aberration occurring at the positive lens groups becomes larger than the amount of change in aberration occurring at the negative lens groups when the environmental condition changes. Especially in this embodiment, where the third lens group G3 comprises positive lenses only, it is essential to control the amount of change in aberration at the third lens group G3 itself in order to keep amount of change of aberration to a minimum when the environmental condition changes.

With respect to the disposition of aberrations upon changes in atmospheric pressure, in this embodiment the projection optical system PL having a refractive power arrangement of (+−+−+), when atmospheric pressure surrounding the projection optical system PL changes, the refractive index of air between each lens element comprising the projection optical system PL changes as well. For example, when atmospheric pressure lowers, so does the refractive index of air, causing the refractive index of optical material comprising each lens element to become greater with respect to that of air. Consequently, at the incident surface of each lens element, the incident angle of a ray entering the incident surface becomes greater, and at the emerging surface of each lens element, the emerging angle of the ray out of respective emerging surfaces becomes greater, thus the influence of change in atmospheric pressure becomes greater.

As for the third lens group G3, the ray bundle emerging from the second lens group G2 having a negative refractive power enters the third lens group G3. At the third lens group G3 of the projection optical system PL according to this embodiment, divergent ray bundle, i.e. the group of divergent rays from the second lens group G2 is guided to the first and second meniscus lenses with the concave surface directed to the incident side of the ray bundle. At each lens surface of the first and second meniscus lenses, both incident and emergent angles (of the ray bundle) can be reduced with respect to the group of incident rays entering in divergent status from the second lens incident group G2. Also, the group of rays from the first and second meniscus lenses becomes a convergent ray bundle, i.e. a group of convergent rays and goes to the fourth lens group G4; then, since the third and fourth meniscus lenses have the meniscus shape where the concave surface is directed to the emerging side of the ray bundle, or, in other words, meniscus shape where the convex surface is directed to the incident side of the ray bundle, it is possible to reduce its incident and emergent angles with respect to the group of rays going to the fourth lens group G4 at each lens surface of the third and fourth meniscus lenses.

Thus, the lens group is structured in such a way that incident and emergent angles at each lens surface comprising the first to fourth meniscus lenses are small, where, if atmospheric pressure changes, it is possible to keep the amount of change in aberration occurring due to change of refractive index of air small. Also, this embodiment has a structure where the lens with the maximum effective diameter among the third lens group is placed between the first and fourth meniscus lenses. Otherwise, (i.e. if the lens with the maximum effective diameter among the third lens group is placed on the side closer to the reticle from the first meniscus lens, or on the side closer to the wafer from the fourth meniscus lens) the status of the ray bundle which passes through the third lens group G3 will not be a group of divergent rays with respect to the first and second meniscus lenses, or the ray bundle which comes out of the third and fourth meniscus lenses will not become a group of convergent rays.

This embodiment has a structure where the third lens group G3 balances aberrations by generating opposite coma aberration against the coma aberration occurring the fourth lens group G4 and the latter half of the fifth lens group G5. Observing the lower meridional ray among the off-axial ray bundle which passes through the third lens group G3; in the structure where incident and emergent angles of the lower meridional ray at each lens surface of the third lens group G3 becomes greater (e.g., when atmospheric pressure is reduced), coma aberration is excessively corrected at the third lens group G3, rendering outer coma to be generated on image surface. Therefore, the third lens group G3 of this embodiment has the first and second meniscus lenses with the concave surface directed to the reticle R and the third and fourth meniscus lenses with the concave surface directed to the wafer W, which makes it possible to minimize the incident and emergent angles of the lower meridional ray among the off-axial ray bundle passing through the third lens group G3 at each lens surface. As a result, the amount of change in coma aberration due to change of atmospheric pressure can be reduced.

For example, having the third lens group G3 include only of double convex lenses is not desirable because the incident and emergent angles of the lower meridional ray with respect to each lens surface of the third lens group G3 are increased, causing coma aberration to change when atmospheric pressure changes. Although it is possible to cancel the amount of change in coma aberration occurring at the third lens group G3 by increasing the incident and emergent angles with respect to each lens surface of a ray passing through the fourth and fifth lens groups G4 and G5 in this case (i.e. when incident and emergent angles of the lower meridional ray with respect to each lens surface of the third lens group G3 are large), it is not desirable because it increases the amount of both higher order spherical aberration and higher order coma aberration occurring under an ideal condition, both of which are difficult to correct.

As in this embodiment, by having the third lens group G3 comprised of the first and second meniscus lenses with the concave surface directed to the reticle R and the third and fourth meniscus lenses with the concave surface directed to the wafer W, it is possible to reduce the incident and emergent angles with respect to each lens surface of on-axis ray bundle passing through the third lens group G3. As a result, the amount of change in spherical aberration can be reduced when atmospheric pressure changes.

It is desirable for each lens element L31 to L35 included in the third lens group G3 to satisfy the following conditions:

$$|\mathrm{SIN}\,(\beta)|<0.5 \tag{19}$$

$$|(\alpha-\beta)/(\alpha-\gamma)|<1.5, \tag{20}$$

where,

α is an incident angle of the principal ray corresponding to the maximum image height of the projection optical system PL to the first-object-side lens surface of a lens element, and/or an emergent angle of the principal ray corresponding to the maximum image height of the projection optical system PL from the second-object-side lens surface of a lens element, β is an incident angle of the lower meridional ray corresponding to the maximum image height of the projection optical system PL to the first-object-side lens surface of a lens element, and/or an emergent angle of the lower meridional ray corresponding to the maximum image height of the projection optical system PL from the second-object-side lens surface of a lens element, and γ is an incident angle of the upper meridional ray corresponding to the maximum image height of the projection optical system PL to the first-object-side lens surface of a lens element, and/or an emergent angle of the upper meridional ray corresponding to the maximum image height of the projection optical system PL from the second-object-side lens surface of a lens element.

The condition (19) determines the incident and emergent angles of the lower meridional ray which passes through lens surfaces of each lens element comprising the third lens group G3. It is not desirable to have the lens surface of each lens element comprising the third lens group G3 out of the range of the above condition (19) because at each lens surface the incident and emergent angles of the lower meridional ray which passes through the third lens group G3 become excessively large, rendering the amount of change of coma aberration excessively large when atmospheric pressure changes.

The condition (20) determines the incident and emergent angles of the upper meridional ray, lower meridional ray and principal ray which pass through lens surfaces of each lens element comprising the third lens group G3. It is not desirable to have the lens surface of each lens element comprising the third lens group G3 out of the range of the above condition (20) because the incident and emergent angles of the upper meridional ray at each lens surface become excessively small, rendering the amount of change of coma aberration occurring in the third lens group excessively large when the atmospheric pressure changes.

This embodiment has a structure where the aperture stop AS is placed within the fifth lens group G5, which makes it possible to lessen the amount of coma aberration occurring within the fifth lens group G5. This structure also makes it possible to further reduce the amount of change in coma aberration due to the atmospheric pressure change because it can increase the height of the principle ray, which passes through the third lens group G3 with respect to the optical axis.

This embodiment has on the wafer W side from the aperture stop AS, the first air-spaced doublet including of a negative meniscus lens L53 with the concave surface directed to the wafer W and a double convex positive lens L54, and the second air-spaced doublet including of a double convex positive lens L55 and a negative lens L56 with the concave surface directed to the reticle R. The first and second air-spaced doublets mainly contributes to the correction of spherical aberration under the ideal environment.

When atmospheric pressure changes, the spherical aberrations occurring at the concave surfaces of negative lenses in the first and second air-spaced doublet fluctuates in the opposite direction of the spherical aberrations at the fifth lens group G5 generated by the atmospheric pressure change, which makes it possible to minimize the amount of change in spherical aberration as a whole even when atmospheric pressure changes. When at least one lens element among those comprising the first and second air-spaced doublets does not have the maximum effective diameter among the fifth lens group G5, the correction of spherical aberration becomes difficult under an ideal condition, and dispositions of aberrations at negative lenses of the first and second air-spaced doublets become different.

The influence of temperature change upon an optical system is a sum of the change in aberrations brought about as a result of the change in shapes of optical materials due to expansion and contraction, the change in aberrations brought about as a result of the change in the refractive index of optical materials, the change in aberrations brought about as a result of the expansion and contraction of lens supporting members, and the change in aberrations brought about as a result of reciprocal actions among each of these items.

As mentioned above, as the projection optical system PL of this embodiment has a refractive power arrangement of (+−+−+), when the temperature of the optical system changes, aberrations which vary in the positive lens groups and those which vary in the adjacent negative lens groups are opposite and tend to cancel each other. Furthermore, the first lens group G1, the second lens group G2 and the fifth lens group G5 of this embodiment are made up of the combination of positive lens elements and negative lens elements. This structure makes it possible to cancel the change in aberration occurring in positive lens elements by negative lens elements when the temperature changes.

Let us observe the third lens group G3 practically made up of positive lens elements. The third lens group G3 of this embodiment includes, in order from the side of reticle R, the first and second meniscus lenses L31 and L32 having a positive refractive power with the concave surface directed to the side of reticle R and the third and fourth meniscus lenses L34 and L35 having a positive refractive power with the concave surface directed to the side of wafer W. Due to the structure where the lens having the maximum effective diameter among the third lens group G3 is placed between the first meniscus lens L31 and the fourth meniscus lens L35, the group of divergent rays enters the first and second meniscus lenses L31 and L32, and the group of convergent rays emerges from the third and fourth meniscus lenses L34 and L35. Therefore, incident and emergent angles of the group of divergent rays at each lens surface which passes through the first and second meniscus lenses L31 and L32 can be reduced, and incident and emergent angles of the group of convergent rays at each lens surface which passes through the third and fourth meniscus lenses L34 and L35 also can be reduced. Reducing incident and emergent angles at each lens surface denotes reducing the amount of aberrations occurring at each lens surface; if the temperature changes, the amount of change in aberrations can be kept extremely small since the original aberrations are small.

However, it is difficult to balance coma aberration under an ideal environment (i.e. ideal temperature) only by the structure of the third lens group G3 mentioned above. Therefore, this embodiment draws the aperture stop AS nearer to wafer W by having the aperture stop AS in the fifth lens group G5 so as to reduce coma aberration occurring in the fifth lens group itself.

Observing the fifth lens group G5 of this embodiment; the first air-spaced doublet includes a negative meniscus lens L53 with the concave surface directed to the wafer side and a double convex positive lens L54 and the second air-spaced doublet includes a double convex positive lens L55 and a negative lens L56 with the concave surface directed to the side of reticle R are placed on the side closer to the wafer W from the aperture stop AS, wherein at least one lens element among those comprising the first and second air-spaced doublets has the maximum effective diameter among the fifth lens group G5.

With this structure, when temperature changes, spherical and coma aberrations generated at concave surface of negative lenses of the first and second air-spaced doublets fluctuate in the opposite direction of the spherical and coma aberrations of the projection optical system PL as a whole when temperature changes, which makes it possible to keep the total amount of change in the spherical and coma aberrations small. Furthermore, the concave surfaces of negative lenses in the first and second air-spaced doublets have a function to correct the change in image height at the maximum image height position of the projection optical system PL when temperature changes.

It is desirable for the projection optical system PL of this embodiment to satisfy the following conditions:

$$0.10 < f1/L < 0.25 \tag{21}$$

$$-0.09 < f2/L < -0.03 \tag{22}$$

$$0.05 < f3/L < 0.20 \tag{23}$$

$$-0.10 < f4/L < -0.02 \tag{24}$$

$$0.05 < f5/L < 0.20, \tag{25}$$

where, f1 is the focal length of the first lens group G1,
f2 is the focal length of the second lens group G2,
f3 is the focal length of the third lens group G3,
f4 is the focal length of the fourth lens group G4,
f5 is the focal length of the fifth lens group G5 and
L is the distance between object and image (the distance from the first object (reticle R) to the second object (wafer W)).

Condition (21) determines the range of optimal focal length of the first lens group G1 having a positive refractive power; it is not desirable to exceed the upper limit because the correction of negative distortion will become difficult. It is not desirable to go below the lower limit because the correction of the spherical aberration of the pupil will become difficult. Condition (22) determines the range of optimal focal length of the second lens group G2 having a negative refractive power; it is not desirable to exceed the upper limit because the correction of negative distortion which occurs in the second lens group G2 will become difficult. It is not desirable to go below the lower limit because reduction of the Petzval sum and reduction of the total length will become difficult.

Condition (23) determines the range of optimal focal length of the third lens group G3 having a positive refractive power; it is not desirable to exceed the upper limit because the refractive power of the second or fourth lens group becomes weak, making correction of the Petzval sum difficult. It is not desirable to go below the lower limit because correction of coma and distortion will become difficult. Condition (24) determines the range of optimal focal length of the fourth lens group G4 having a negative refractive power; it is not desirable to exceed the upper limit because coma aberration will be generated. It is not desirable to go below the lower limit because reduction of the Petzval sum will become difficult.

Finally, condition (25) determines the range of optimal focal length of the fifth lens group G5 having a positive refractive power. It is not desirable to exceed the upper limit because the refractive power of the fifth lens group becomes too weak, and accordingly the refractive power of the fourth lens group becomes weak, which makes it difficult to keep the Petzval sum small. It is not desirable to go below the lower limit because spherical aberration is generated.

Figure 6:
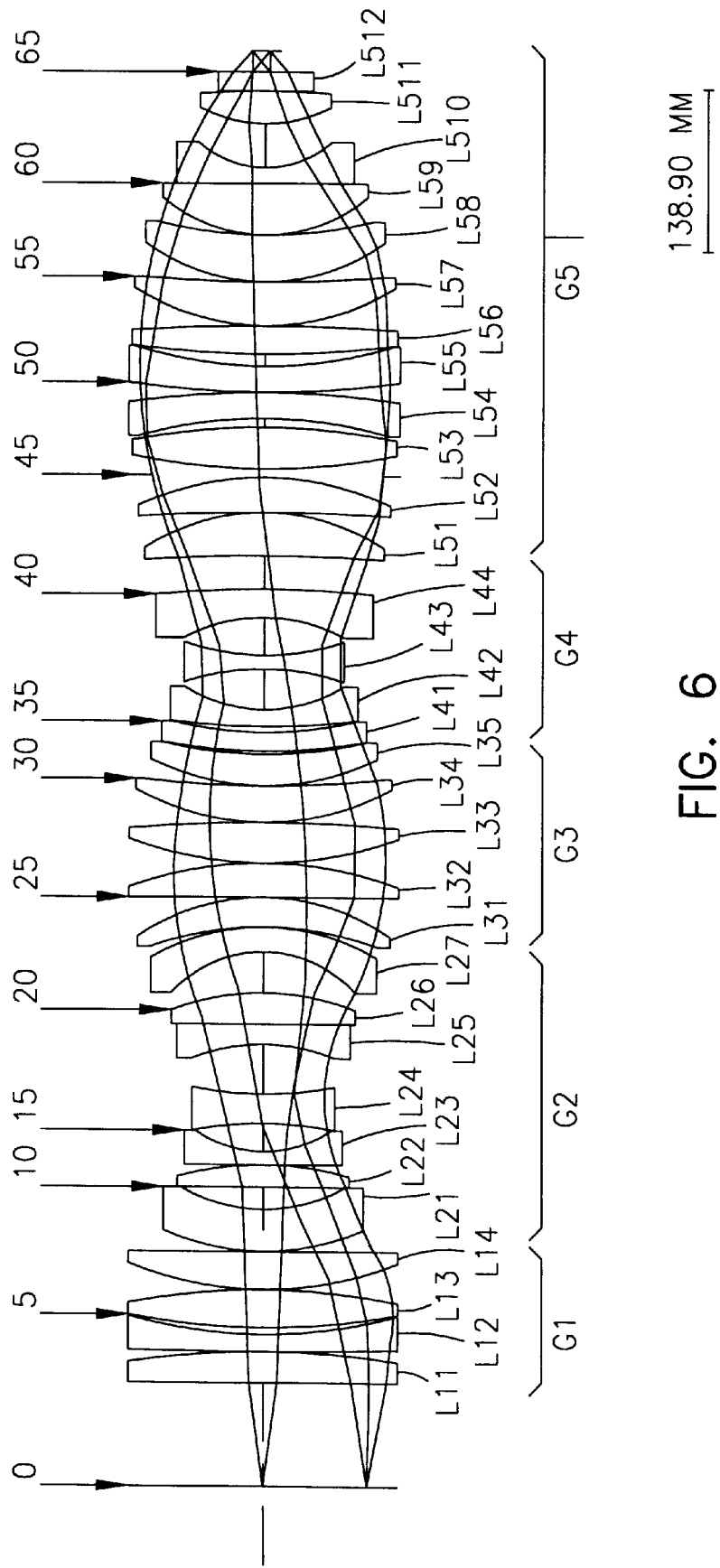
FIG. 6 is a schematic diagram of lenses included in a projection optical system according to a second embodiment of the present invention.

Referring to FIGS. 4 and 6, which show the optical paths of the first and second embodiments, respectively, each of the embodiment based on information shown in FIG. 4 and 6 has, in the order from the side of reticle R as the first object, the first lens group G1 having a positive refractive power, the second lens group G2 having a negative refractive power, the third lens group G3 having a positive refractive power, the fourth lens group G4 having a negative refractive power and the fifth lens group G5 having a positive refractive power. In the projection optical system according to the first and second embodiments, the first object side (reticle R side) and the second object side (wafer W side) are practically telecentric, where a reduced image of the first object is transferred onto the second object.

Referring more particularly to the projection optical system according to the first embodiment shown in FIG. 4, this embodiment has, in order from the side of the first object, the first lens group G1 having a positive refractive power, the second lens group G2 having a negative refractive power as a whole which includes a negative meniscus lens L21 placed closest to the first object side with the concave surface directed to the second object side and a negative meniscus lens L27 placed closest to the second object side with the concave surface directed to the first object side, the third lens group G3 having a positive refractive power, the fourth lens group G4 having a negative refractive power as a whole which includes a negative meniscus lens L41 placed closest to the first object side with the concave surface directed to the second object side and a plano-concave lens L44 placed closest to the second object side with the concave surface directed to the first object side, and the fifth lens group G5 including a positive lens L51 placed closest to the first object side and an aperture stop placed on the side closer to the second object from the positive lens L51.

The first lens group G1 includes, in order from the reticle R side, a plano-convex lens L11 with the convex surface directed to the wafer W side, a negative meniscus lens L12 with the concave surface directed to the wafer W side, a double convex positive lens L13 and a positive meniscus lens L14 with the convex surface directed to the reticle R side. The second lens group G2 includes, in order from the reticle R side, a negative meniscus lens L21 with the concave surface directed to the wafer W side, a double convex positive lens L22 with a strong convex surface directed to the wafer W side, a plano-concave lens L23 with the concave surface directed to the wafer W side, a double concave negative lens L24, a piano-concave lens L25 with the concave surface directed to the reticle R side, a plano-convex lens L26 with the convex surface directed to the wafer W side and a negative meniscus lens L27 with the concave surface directed to the reticle R side.

The third lens group G3 includes, in order from the reticle R side, a positive meniscus lens L31 as the first meniscus lens with the concave surface directed to the reticle R side, a positive meniscus lens L32 as the second meniscus lens with the concave surface directed to the reticle R side, a double convex positive lens L33, a positive meniscus lens L34 as the third meniscus lens with the concave surface directed to the wafer W side and a positive meniscus lens L35 as the fourth meniscus lens with the concave surface directed to the wafer W side.

Figure 5:
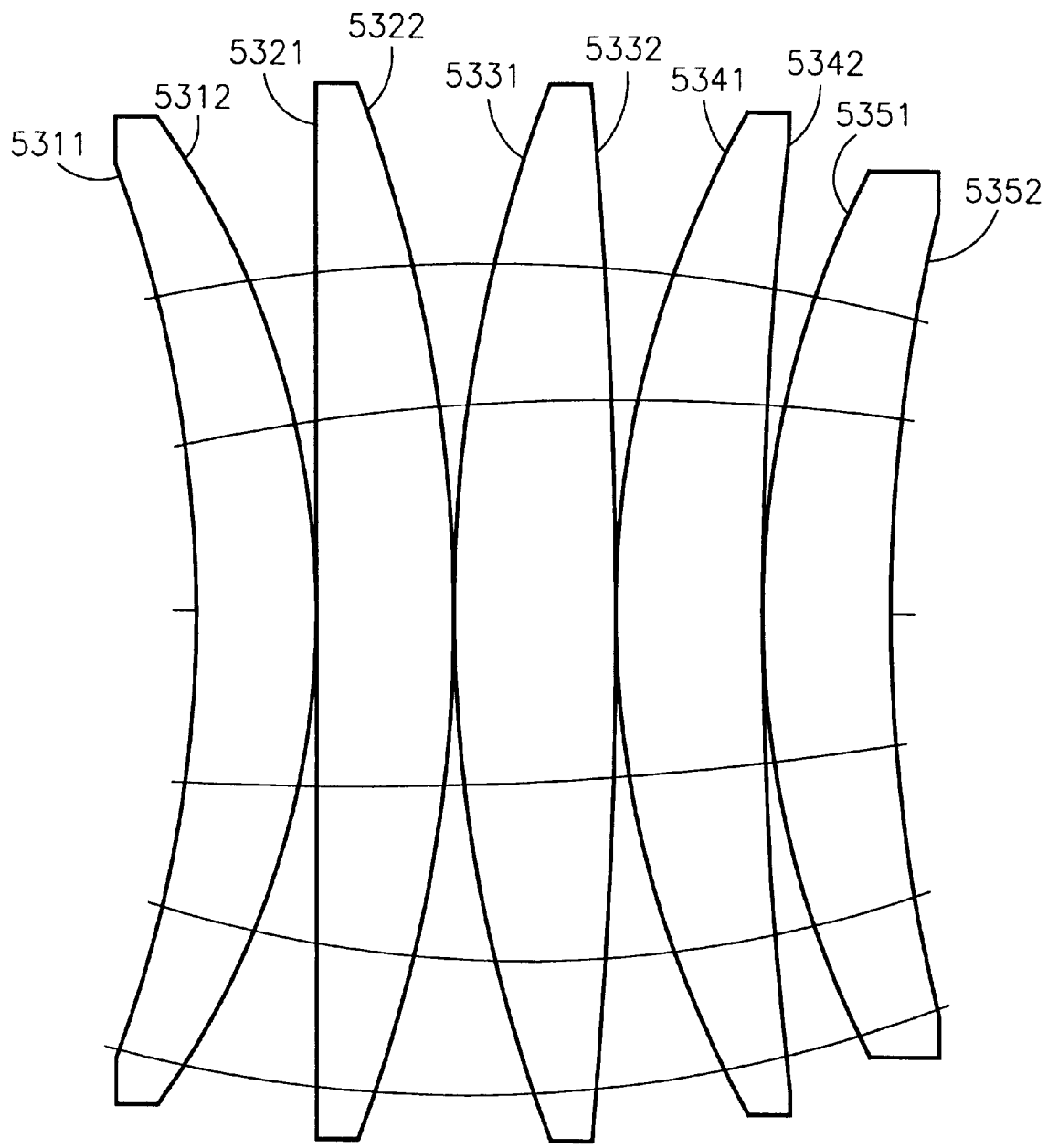
FIG. 5 is a detailed diagram of the lenses included in the third lens group of the projection optical system according to the first embodiment of the present invention.

As shown in FIG. 5, the positive meniscus lens L31 in the third lens group G3 has the first-object-side lens surface S311 as the incident surface and the second-object-side lens surface S312 as the emergent surface. The positive meniscus lens L32 has the first-object-side lens surface S321 as the incident surface and the second-object-side lens surface S322 as the emergent surface. The double convex positive lens L33 has the first-object-side lens surface S331 as the incident surface and the second-object-side lens surface S332 as the emergent surface. The positive meniscus lens L34 has the first-object-side lens surface S341 as the incident surface and the second-object-side lens surface S342 as the emergent surface. The positive meniscus lens L35 has the first-object-side lens surface S351 as the incident surface and the second-object-side lens surface S352 as the emergent surface.

Referring to FIG. 4, the fourth lens group G4 includes, in order from the reticle R side, a negative meniscus lens L41 with the concave surface directed to the wafer W side, a negative meniscus lens L42 with the concave surface directed to the wafer W side similarly, a double concave negative lens L43 and a plano-convex lens L44 with the concave surface directed to the reticle R side. The fifth lens group includes, in order from the reticle R side, a double convex lens L51 with a strong convex surface directed to the wafer W side, a positive meniscus lens L52 with the concave surface directed to the reticle R side, an aperture stop AS, a double convex lens L53, a negative meniscus lens L54 with the concave surface directed to the reticle R side, a negative meniscus lens L55 with the concave surface directed to the wafer W side, a double-convex positive lens L56, a positive meniscus lens L57 with the convex surface directed to the reticle R side, a positive meniscus lens L58 with the convex surface directed to the reticle R side similarly, a positive meniscus lens L59 with the convex surface directed to the reticle R side, a negative meniscus lens L510 with the convex surface directed to the reticle R side, a positive meniscus lens L511 with the convex surface directed to the reticle R side, and a piano-concave lens L512 with concave surface directed to the wafer W side.

Table 1 below shows the values of specifications for the above first embodiment. In table 1, the numbers in the left end column indicate the order from the first object side (reticle side), r is the curvature radius of the lens surface (0.000 equals infinity in this table), d is the distance between lens surfaces, n is the refractive index of optical material when exposure wavelength λ is 365 nm, φ is the effective diameter of each lens element, E is the expansion ratio of optical material which comprises the lens element, dn/dt is the thermal refractive index coefficient of optical material which comprises the lens element, and D is the distance from flange to the supporting point of each lens element. Also in table 1, dO is the distance from the first object (reticle) to the closest lens surface on the side of the first object (reticle side), and Bf is the distance from the lens surface which is closest to the second object to the second object (wafer). In the projection optical system of the first embodiment shown in FIG. 4, the distance between object and image (the distance between the object surface to the image surface along the optical axis) L is 1200, the image side numerical aperture is 0.62, the projection magnification B is −⅕ and the diameter of exposure field at wafer W is 31.2.

TABLE 1 dO = 89.650
Bf = 21.655

| | r | d | n | φ | E | dn/dT | D |
|---|---|---|---|---|---|---|---|
| 1 | 0.000 | 24.000 | 1.61548 | 178.197 | $6.1 \times 10^{-6}$ | $7.5 \times 10^{-6}$ | −694.728 |
| 2 | −531.881 | 0.500 | | 180.687 | | | |
| 3 | 1104.059 | 18.000 | 1.61265 | 181.138 | $11.0 \times 10^{-6}$ | $5.8 \times 10^{-6}$ | −662.352 |
| 4 | 255.431 | 5.483 | | 179.922 | | | |
| 5 | 327.711 | 35.384 | 1.48858 | 180.689 | $16.3 \times 10^{-6}$ | $-4.6 \times 10^{-6}$ | −639.286 |
| 6 | −359.443 | 0.500 | | 181.588 | | | |
| 7 | 185.781 | 30.655 | 1.61548 | 176.930 | $6.1 \times 10^{-6}$ | $7.5 \times 10^{-6}$ | −593.691 |
| 8 | 1322.182 | 1.132 | | 171.629 | | | |
| 9 | 168.786 | 20.000 | 1.61265 | 158.656 | $11.0 \times 10^{-6}$ | $5.8 \times 10^{-6}$ | −564.219 |
| 10 | 119.569 | 21.502 | | 139.546 | | | |
| 11 | 1072.143 | 19.611 | 1.48858 | 138.873 | $16.3 \times 10^{-6}$ | $-4.6 \times 10^{-6}$ | −540.573 |
| 12 | −360.000 | 0.538 | | 134.563 | | | |
| 13 | 0.000 | 11.778 | 1.61548 | 128.763 | $6.1 \times 10^{-6}$ | $7.5 \times 10^{-6}$ | −514.976 |
| 14 | 109.248 | 22.806 | | 114.851 | | | |
| 15 | −326.667 | 19.026 | 1.61548 | 114.746 | $6.1 \times 10^{-6}$ | $7.5 \times 10^{-6}$ | −483.735 |
| 16 | 265.643 | 29.341 | | 117.512 | | | |
| 17 | −173.435 | 16.906 | 1.61548 | 122.659 | $6.1 \times 10^{-6}$ | $7.5 \times 10^{-6}$ | −443.206 |
| 18 | 0.000 | 1.476 | | 138.433 | | | |
| 19 | 0.000 | 28.000 | 1.61265 | 139.865 | $11.0 \times 10^{-6}$ | $5.8 \times 10^{-6}$ | −417.086 |
| 20 | −222.691 | 35.745 | | 148.448 | | | |
| 21 | −111.227 | 20.000 | 1.61265 | 156.260 | $11.0 \times 10^{-6}$ | $5.8 \times 10^{-6}$ | −386.305 |
| 22 | −192.996 | 0.633 | | 184.087 | | | |
| 23 | −279.097 | 29.000 | 1.61548 | 190.595 | $6.1 \times 10^{-6}$ | $7.5 \times 10^{-6}$ | −353.519 |
| 24 | −161.834 | 0.500 | | 199.934 | | | |
| 25 | −1975.662 | 28.206 | 1.61548 | 214.220 | $6.1 \times 10^{-6}$ | $7.5 \times 10^{-6}$ | −310.032 |
| 26 | −309.687 | 0.500 | | 217.778 | | | |
| 27 | 440.594 | 30.177 | 1.61548 | 219.590 | $6.1 \times 10^{-6}$ | $7.5 \times 10^{-6}$ | −266.369 |
| 28 | −880.644 | 0.500 | | 218.048 | | | |
| 29 | 238.555 | 28.012 | 1.61548 | 205.013 | $6.1 \times 10^{-6}$ | $7.5 \times 10^{-6}$ | −224.687 |
| 30 | 767.881 | 0.550 | | 198.020 | | | |
| 31 | 194.345 | 25.000 | 1.48858 | 183.229 | $16.3 \times 10^{-6}$ | $-4.6 \times 10^{-6}$ | −192.323 |
| 32 | 276.460 | 4.315 | | 169.007 | | | |
| 33 | 347.485 | 15.000 | 1.61265 | 167.559 | $11.0 \times 10^{-6}$ | $5.8 \times 10^{-6}$ | −180.576 |
| 34 | 279.555 | 6.194 | | 154.365 | | | |
| 35 | 431.474 | 15.091 | 1.61548 | 152.216 | $6.1 \times 10^{-6}$ | $7.5 \times 10^{-6}$ | −154.189 |
| 36 | 115.261 | 32.234 | | 130.700 | | | |
| 37 | −206.306 | 11.776 | 1.61265 | 130.129 | $11.0 \times 10^{-6}$ | $5.8 \times 10^{-6}$ | −122.424 |
| 38 | 243.147 | 29.754 | | 130.481 | | | |
| 39 | −120.027 | 42.742 | 1.61265 | 131.003 | $11.0 \times 10^{-6}$ | $5.8 \times 10^{-6}$ | −79.516 |
| 40 | 0.000 | 1.000 | | 174.761 | | | |
| 41 | 1483.642 | 42.880 | 1.48858 | 179.469 | $16.3 \times 10^{-6}$ | $-4.6 \times 10^{-6}$ | −31.343 |
| 42 | −179.843 | 1.416 | | 189.009 | | | |
| 43 | −2788.744 | 30.003 | 1.48858 | 201.840 | $16.3 \times 10^{-6}$ | $-4.6 \times 10^{-6}$ | 0.615 |
| 44 | −265.715 | 0.846 | | 205.689 | | | |
| 45(AS) | 0.000 | 8.000 | | 206.470 | | | |
| 46 | 380.423 | 36.200 | 1.61548 | 214.892 | $6.1 \times 10^{-6}$ | $7.5 \times 10^{-6}$ | 59.832 |
| 47 | −486.693 | 9.223 | | 215.329 | | | |
| 48 | −297.922 | 20.000 | 1.61265 | 215.089 | $11.0 \times 10^{-6}$ | $5.8 \times 10^{-6}$ | 89.869 |
| 49 | −543.660 | 5.000 | | 220.007 | | | |
| 50 | 322.369 | 20.000 | 1.61265 | 220.834 | $11.0 \times 10^{-6}$ | $5.8 \times 10^{-6}$ | 146.184 |
| 51 | 202.379 | 15.117 | | 212.877 | | | |
| 52 | 357.384 | 33.000 | 1.61548 | 212.280 | $6.1 \times 10^{-6}$ | $7.5 \times 10^{-6}$ | 172.341 |
| 53 | −2968.481 | 0.500 | | 212.838 | | | |
| 54 | 199.918 | 33.785 | 1.48858 | 209.863 | $16.3 \times 10^{-6}$ | $-4.6 \times 10^{-6}$ | 215.379 |
| 55 | 772.323 | 0.500 | | 204.987 | | | |
| 56 | 159.448 | 35.451 | 1.48858 | 191.211 | $16.3 \times 10^{-6}$ | $-4.6 \times 10^{-6}$ | 260.105 |
| 57 | 254.318 | 0.500 | | 175.354 | | | |
| 58 | 129.479 | 42.998 | 1.48858 | 163.255 | $6.3 \times 10^{-6}$ | $-4.6 \times 10^{-6}$ | 288.627 |
| 59 | 4229.259 | 0.500 | | 147.182 | | | |
| 60 | 1082.306 | 15.000 | 1.61265 | 142.777 | $11.0 \times 10^{-6}$ | $5.8 \times 10^{-6}$ | 308.249 |
| 61 | 74.634 | 28.943 | | 106.093 | | | |
| 62 | 78.815 | 28.615 | 1.61548 | 93.187 | $6.1 \times 10^{-6}$ | $7.5 \times 10^{-6}$ | 354.506 |
| 63 | 3000.000 | 2.102 | | 81.008 | | | |
| 64 | 0.000 | 15.007 | 1.61265 | 77.889 | $11.0 \times 10^{-6}$ | $5.8 \times 10^{-6}$ | 378.780 |
| 65 | 820.248 | (Bf) | | 64.145 | | | |

Table 2 below shows the corresponding values of conditions (1) to (18) and (21) to (25) of the first embodiment.

TABLE 2

| | |
|---|---|
| (1) | 0.062 um |
| (2) | 0.014 um |
| (3) | 0.439 um |
| (4) | 0.047 um |
| (5) | 0.035 um |
| (6) | 0.009 um |
| (7) | 0.021 um |
| (8) | 0.729 um |
| (9) | 0.312 um |
| (10) | 0.050 um |
| (11) | 0.245 um |
| (12) | 0.343 um |
| (13) | 0.017 um |
| (14) | 0.143 um |
| (15) | 0.195 um |
| (16) | 0.018 um |
| (17) | 0.039 um |
| (18) | 0.067 um |
| (21) | 0.169 |
| (22) | −0.059 |
| (23) | 0.103 |
| (24) | −0.046 |
| (25) | 0.143 |

Table 3 below shows values corresponding to conditions (19) and (20) of the first embodiment.

TABLE 3

| surface no. | corresponding values to the condition (19) | corresponding values to the condition (20) |
|---|---|---|
| 23 | 0.037 | 0.013 |
| 24 | 0.222 | 0.876 |
| 25 | 0.082 | 0.704 |
| 26 | 0.166 | 0.839 |
| 27 | 0.139 | 1.102 |
| 28 | 0.167 | 0.872 |
| 29 | 0.116 | 0.908 |
| 30 | 0.139 | 0.793 |
| 31 | 0.041 | 0.086 |
| 32 | 0.093 | 0.442 |

The projection optical system PL of the second embodiment shown in FIG. 6 has, in order from the side of the first object, the first lens group G1 having a positive power, the second lens group G2 having a negative refractive power as a whole which includes a negative meniscus lens L21 placed closest to the first object with the concave surface directed to the second object side and a negative meniscus lens L27 placed closest to the second object side with the concave surface directed to the first object side, the third lens group G3 having a positive refractive power, the fourth lens group G4 having a negative refractive power as a whole which includes a negative meniscus lens L41 placed closest to the first object side with the concave surface directed to the second object side and a negative meniscus lens L44 placed closest to the second object side with the concave surface directed to the first object, and the fifth lens group G5 including a positive lens L51 placed closest to the first object side and an aperture stop placed on the side closer to the second object from the positive lens L51.

The first lens group G1 having a positive refractive power includes, in order from the side of reticle R, a double convex positive lens L11, a double concave lens L12 with a strong concave surface directed to the wafer W side, a double convex positive lens L13 and a double convex lens L14 with a strong convex surface directed to the reticle R side. The second lens group G2 includes, in order from the reticle R side, a negative meniscus lens L21 with the convex surface directed to the reticle R side, a double convex positive lens L22, a plano-concave negative lens L23 with a strong concave surface directed to the wafer W side, a double concave negative lens L24, a plano-concave negative lens L25 with a strong concave surface directed to the reticle R side, a convex meniscus lens L26 with a strong convex surface directed to the wafer W side and a negative meniscus lens L27 with the concave surface directed to the reticle R side.

The third lens group G3 includes, in order from the reticle R side, a positive meniscus lens L31 as the first meniscus lens with the concave surface directed to the reticle R side, a positive meniscus lens L32 as the second meniscus lens with the concave surface directed to the reticle R side, a double convex positive lens L33, a positive meniscus lens L34 as the third meniscus lens with the concave surface directed to the wafer W side and a positive meniscus lens L35 as the fourth meniscus lens with the concave surface directed to the wafer W side. The fourth lens group G4 includes, in order from the reticle R side, a negative meniscus lens L41 with the concave surface directed to the wafer W side, a negative meniscus lens L42 with the concave surface directed to the wafer W side similarly, a double concave negative lens L43 and a concave meniscus lens L44 with the concave surface directed to the reticle R side.

The fifth lens group G5 includes, in order from the reticle R side, a positive meniscus lens L51 with the convex surface directed to the wafer W side, a positive meniscus lens L52 with the convex surface directed to the wafer W side, an aperture stop AS, a double convex positive lens L53, a negative meniscus lens L54 with the concave surface directed to the reticle R side, a negative meniscus lens L55 with the concave surface directed to the wafer W side, a double convex positive lens L56, a positive meniscus lens L57 with the convex surface directed to the reticle R side, a positive meniscus lens L58 with the convex surface directed to the reticle R side similarly, a positive meniscus lens L59 with the convex surface directed to the reticle R side, a negative meniscus lens L510 with the concave surface directed to the wafer W side, a positive meniscus lens L511 with the convex surface directed to the reticle R side and a plano-concave lens L512 with the concave surface directed to the wafer W side.

Table 4 below shows the values of specifications of the above second embodiment. In table 4, the numbers in the left end column indicate the order from the first object side (reticle side), r is the curvature radius of the lens surface (0.000 equals infinity in this table), d is the distance between lens surfaces, n is the refractive index of optical material when exposure wavelength λ is 365 nm, φ is the effective diameter of each lens element, E is the expansion ratio of optical material which comprises the lens element, dn/dt is the thermal refractive index coefficient of optical material which comprises the lens element. Also in table 4, dO is the distance from the first object (reticle) to the closest lens surface on the side of the first object (reticle side), and Bf is the distance from lens surface which is closest to the second object to the second object (wafer). In the projection optical system of second embodiment shown in FIG. 6, the distance between object and-image (the distance between the object surface to the image surface along the optical path) L is 1200, the image side numerical aperture is 0.57, the projection magnification B is −⅕ and the diameter of exposure field at wafer W is 31.2.

TABLE 4 d0 = 89.650
Bf = 21.655

| | r | d | n | φ | E | dn/dT | D |
|---|---|---|---|---|---|---|---|
| 1 | 555.188 | 24.000 | 1.61548 | 178.494 | $6.1 \times 10^{-6}$ | $7.5 \times 10^{-6}$ | −692.683 |
| 2 | −631.380 | 0.500 | | 178.675 | | | |
| 3 | −1314.268 | 15.000 | 1.61265 | 178.104 | $11.0 \times 10^{-6}$ | $5.8 \times 10^{-6}$ | −668.247 |
| 4 | 308.194 | 9.512 | | 176.852 | | | |
| 5 | 799.387 | 36.000 | 1.48858 | 177.316 | $16.3 \times 10^{-6}$ | $-4.6 \times 10^{-6}$ | −637.495 |
| 6 | −337.323 | 0.500 | | 179.829 | | | |
| 7 | 392.053 | 24.352 | 1.61548 | 178.199 | $6.1 \times 10^{-6}$ | $7.5 \times 10^{-6}$ | −603.455 |
| 8 | −1296.268 | 1.132 | | 175.750 | | | |
| 9 | 164.687 | 43.000 | 1.61265 | 164.038 | $11.0 \times 10^{-6}$ | $5.8 \times 10^{-6}$ | −557.639 |
| 10 | 132.580 | 12.823 | | 136.056 | | | |
| 11 | 308.675 | 25.125 | 1.48858 | 135.393 | $16.3 \times 10^{-6}$ | $-4.6 \times 10^{-6}$ | −524.551 |
| 12 | −346.757 | 0.538 | | 130.437 | | | |
| 13 | 0.000 | 11.778 | 1.61548 | 124.203 | $6.1 \times 10^{-6}$ | $7.5 \times 10^{-6}$ | −500.268 |
| 14 | 109.864 | 22.886 | | 109.911 | | | |
| 15 | −245.687 | 19.026 | 1.61548 | 109.537 | $6.1 \times 10^{-6}$ | $7.5 \times 10^{-6}$ | −468.416 |
| 16 | 249.948 | 29.177 | | 111.375 | | | |
| 17 | −133.699 | 16.906 | 1.61548 | 115.225 | $6.1 \times 10^{-6}$ | $7.5 \times 10^{-6}$ | −428.042 |
| 18 | 0.000 | 1.840 | | 133.121 | | | |
| 19 | −3783.753 | 28.000 | 1.61265 | 134.418 | $11.0 \times 10^{-6}$ | $5.8 \times 10^{-6}$ | −402.537 |
| 20 | −184.592 | 46.411 | | 143.127 | | | |
| 21 | −112.744 | 21.759 | 1.61265 | 157.111 | $11.0 \times 10^{-6}$ | $5.8 \times 10^{-6}$ | −359.857 |
| 22 | −170.639 | 0.937 | | 183.154 | | | |
| 23 | −331.042 | 29.000 | 1.61548 | 193.566 | $6.1 \times 10^{-6}$ | $7.5 \times 10^{-6}$ | −321.651 |
| 24 | −175.469 | 0.601 | | 201.889 | | | |
| 25 | −2161.494 | 26.575 | 1.61548 | 212.404 | $6.1 \times 10^{-6}$ | $7.5 \times 10^{-6}$ | −281.024 |
| 26 | −325.080 | 0.500 | | 215.162 | | | |
| 27 | 555.883 | 26.228 | 1.61548 | 214.695 | $6.1 \times 10^{-6}$ | $7.5 \times 10^{-6}$ | −240.461 |
| 28 | −1325.450 | 0.500 | | 212.868 | | | |
| 29 | 232.785 | 28.012 | 1.61548 | 202.703 | $6.1 \times 10^{-6}$ | $7.5 \times 10^{-6}$ | −201.291 |
| 30 | 737.420 | 0.510 | | 196.084 | | | |
| 31 | 171.317 | 25.000 | 1.48858 | 180.462 | $16.3 \times 10^{-6}$ | $-4.6 \times 10^{-6}$ | −168.643 |
| 32 | 263.216 | 4.647 | | 168.225 | | | |
| 33 | 334.109 | 15.000 | 1.61265 | 166.715 | $11.0 \times 10^{-6}$ | $5.8 \times 10^{-6}$ | −151.334 |
| 34 | 147.477 | 6.194 | | 146.515 | | | |
| 35 | 179.817 | 15.874 | 1.61548 | 145.159 | $6.1 \times 10^{-6}$ | $7.5 \times 10^{-6}$ | −128.080 |
| 36 | 118.970 | 31.868 | | 130.150 | | | |
| 37 | −243.708 | 11.776 | 1.61265 | 128.421 | $11.0 \times 10^{-6}$ | $5.8 \times 10^{-6}$ | −99.096 |
| 38 | 295.224 | 28.997 | | 126.918 | | | |
| 39 | −118.373 | 15.239 | 1.61265 | 127.550 | $11.0 \times 10^{-6}$ | $5.8 \times 10^{-6}$ | −70.965 |
| 40 | −816.863 | 23.427 | | 145.176 | | | |
| 41 | −1141.486 | 33.144 | 1.48858 | 165.190 | $16.3 \times 10^{-6}$ | $-4.6 \times 10^{-6}$ | −18.230 |
| 42 | −176.634 | 0.500 | | 173.223 | | | |
| 43 | −891.966 | 23.434 | 1.48858 | 179.942 | $16.3 \times 10^{-6}$ | $-4.6 \times 10^{-6}$ | 6.044 |
| 44 | −268.530 | 10.149 | | 183.581 | | | |
| 45(AS) | 0.000 | 5.000 | | 184.271 | | | |
| 46 | 696.535 | 41.200 | 1.61548 | 188.228 | $6.1 \times 10^{-6}$ | $7.5 \times 10^{-6}$ | 68.129 |
| 47 | −294.506 | 4.552 | | 189.845 | | | |
| 48 | −250.731 | 18.000 | 1.61265 | 189.600 | $11.0 \times 10^{-6}$ | $5.8 \times 10^{-6}$ | 97.299 |
| 49 | −506.743 | 0.500 | | 195.822 | | | |
| 50 | 415.632 | 18.000 | 1.61265 | 198.709 | $11.0 \times 10^{-6}$ | $5.8 \times 10^{-6}$ | 136.418 |
| 51 | 267.230 | 6.950 | | 196.095 | | | |
| 52 | 374.561 | 35.000 | 1.61548 | 196.561 | $6.1 \times 10^{-6}$ | $7.5 \times 10^{-6}$ | 167.014 |
| 53 | −9613.854 | 0.500 | | 196.280 | | | |
| 54 | 264.692 | 24.937 | 1.48858 | 195.612 | $16.3 \times 10^{-6}$ | $-4.6 \times 10^{-6}$ | 200.039 |
| 55 | 672.783 | 0.500 | | 191.953 | | | |
| 56 | 160.583 | 41.955 | 1.48858 | 185.603 | $16.3 \times 10^{-6}$ | $-4.6 \times 10^{-6}$ | 240.096 |
| 57 | 848.012 | 0.500 | | 175.081 | | | |
| 58 | 121.040 | 39.977 | 1.48858 | 154.843 | $11.0 \times 10^{-6}$ | $-4.6 \times 10^{-6}$ | 279.238 |
| 59 | 742.443 | 0.500 | | 138.301 | | | |
| 60 | 888.126 | 15.036 | 1.61265 | 138.352 | $11.0 \times 10^{-6}$ | $5.8 \times 10^{-6}$ | 296.102 |
| 61 | 71.259 | 36.011 | | 105.360 | | | |
| 62 | 82.714 | 32.442 | 1.61548 | 90.414 | $6.1 \times 10^{-6}$ | $7.5 \times 10^{-6}$ | 350.547 |
| 63 | 31489.489 | 1.286 | | 75.130 | | | |
| 64 | 0.000 | 16.135 | 1.61265 | 73.228 | $11.0 \times 10^{-6}$ | $5.8 \times 10^{-6}$ | 378.198 |
| 65 | 527.377 | (Bf) | | 59.584 | | | |

Table 5 below shows values corresponding to conditions (1) to (18) and (21) to (25) of the second embodiment.

TABLE 5

| | |
|---|---|
| (1) | 0.002 um |
| (2) | 0.005 um |
| (3) | 0.427 um |
| (4) | 0.044 um |
| (5) | 0.076 um |
| (6) | 0.004 um |
| (7) | 0.006 um |
| (8) | 0.691 um |
| (9) | 0.258 um |
| (10) | 0.081 um |
| (11) | 0.307 um |
| (12) | 0.347 um |
| (13) | 0.014 um |
| (14) | 0.143 um |
| (15) | 0.234 um |
| (16) | 0.008 um |
| (17) | 0.003 um |
| (18) | 0.001 um |
| (21) | 0.230 |
| (22) | −0.079 |
| (23) | 0.107 |
| (24) | −0.054 |
| (25) | 0.128 |

Table 6 below shows the values corresponding to conditions (19) and (20) according to the second embodiment.

TABLE 6

| surface no. | corresponding values to the condition (19) | corresponding values to the condition (20) |
|---|---|---|
| 23 | 0.040 | 0.118 |
| 24 | 0.218 | 0.913 |
| 25 | 0.062 | 0.536 |
| 26 | 0.172 | 0.883 |
| 27 | 0.093 | 0.847 |
| 28 | 0.130 | 0.824 |
| 29 | 0.135 | 1.056 |
| 30 | 0.122 | 0.775 |
| 31 | 0.088 | 0.674 |
| 32 | 0.083 | 0.314 |

Referring to FIGS. 7–16, the operation of the projection optical system of the first and second embodiments when atmospheric pressure and temperature changes will be discussed in conjunction with the data illustrated in graphical form. With respect to the modulation transfer function MTF and aberrations, which are generated when atmospheric pressure changes make the atmospheric pressures in each air gap between lens elements included in the projection optical system PL change; the illustrated data is based on the refractive indexes of these air gaps. As for MTF and aberrations occurring when temperature-changes, the illustrated data is based on lens data calculated according to the relational expressions (A)–(E) below.

With respect to changes in lens parameters when temperature changes, referring again to FIG. 2, this embodiment can maintain the distance between the flange FL and reticle R constant because flange FL of lens barrel LB is supported by carriage CA of the main body of the projection exposure apparatus. This allows the position of reticle R on the optical axis to be freely modified even when temperature changes. In the example shown in FIG. 2, the lens barrel LB, the supporting members H1~H5 and the spacers SP1~SP5 are all to be made of the same material. When the curvature radius of the first-object side (reticle R side) lens surface of the lens element G1 shown in FIG. 2 in an ideal environment is r11, the curvature radius of the second-object side (wafer W side) lens surface of the lens element G1 in an ideal environment is r12, the lens thickness of the lens element G1 in an ideal environment is t1, the distance on the optical axis direction between the supporting point where the supporting member H1 supports the lens element G1 and the flange FL in an ideal environment is d1, the refractive index of optical members comprising lens element G1 in an ideal environment is n1, the expansion coefficient of lens element G1 is E1, the expansion coefficient of members comprising the lens barrel LB, supporting members H1~H5 and the spacers SP1~SP5 is EM, and the thermal refractive index coefficient of optical member comprising lens element G1 is (dn/dT)1.

When temperature changes by +T° C., the curvature radius r11' of the first-object side lens surface of the lens element G1, the curvature radius r12' of the second-object side lens surface of the lens element G1, the lens thickness t1' of the lens element G1, the distance d1' in the optical axis direction between the supporting point where the supporting member H1 supports the lens element G1 and the flange FL, and the refractive index n1' of optical member comprising lens element G1 are expressed as below, respectively:

$$r11'=r11+r\times E1\times T$$

$$t1'=t1+t1\times E1\times T$$

$$r21'=r21+r21\times E1\times T$$

$$d1'=d1+d1\times EM\times T$$

$$n1'=n1+(dn/dT)1\times T$$

In the same manner, as for the mth (m is a natural integer) lens element Gm, when the curvature radius of the first-object side (reticle R side) lens surface of the lens element Gm in an ideal environment is rm1, the curvature radius of the second-object side (wafer W side) lens surface of the lens element Gm in an ideal environment is rm2, the lens thickness of lens element Gm in an ideal environment is tm, the distance on the optical axis direction between the supporting point where the supporting member Hm supports the lens element Gm and the flange FL in an ideal environment is dm, the refractive index of optical members comprising lens element Gm in an ideal environment is nm, the expansion coefficient of lens element Gm is Em, the expansion coefficient of members comprising the lens barrel LB, supporting members and spacers is EM, and the temperature coefficient of optical member comprising the lens element Gm is (dn/dT)m.

When temperature changes by +T° C., the curvature radius rm1' of the first-object side lens surface of the lens element Gm, the curvature radius rm2' of the second-object side lens surface of the lens element Gm, the lens thickness tm' of the lens element Gm, the distance dm' in direction of the optical axis between the supporting point where the supporting member Hm supports the lens element Gm and the flange FL, and the refractive index nm' of optical members comprising lens element Gm are expressed as below, respectively:

$$rm1'=rm1+rm1\times Em\times T \qquad (A)$$

$$tm'=tm+tm\times Em\times T \qquad (B)$$

$$r2m'=r2m+rm2\times Em\times T \qquad (C)$$

$$dm'=dm+dm\times EM\times T \qquad (D)$$

$$nm'=nm+(dn/dT)m\times T \qquad (E)$$

When a temperature change occurs, the parameters of each lens element at the changed temperature is calulated based on (A) to (E) above, and MTF and aberrations are calculated using the lens data obtained by the result of the calculations. In the example shown in FIG. 3, the above conditions can be applied when the sub lens barrels LB1~LB5 and spacers SP1~SP5 are made of the same material.

Figure 7:
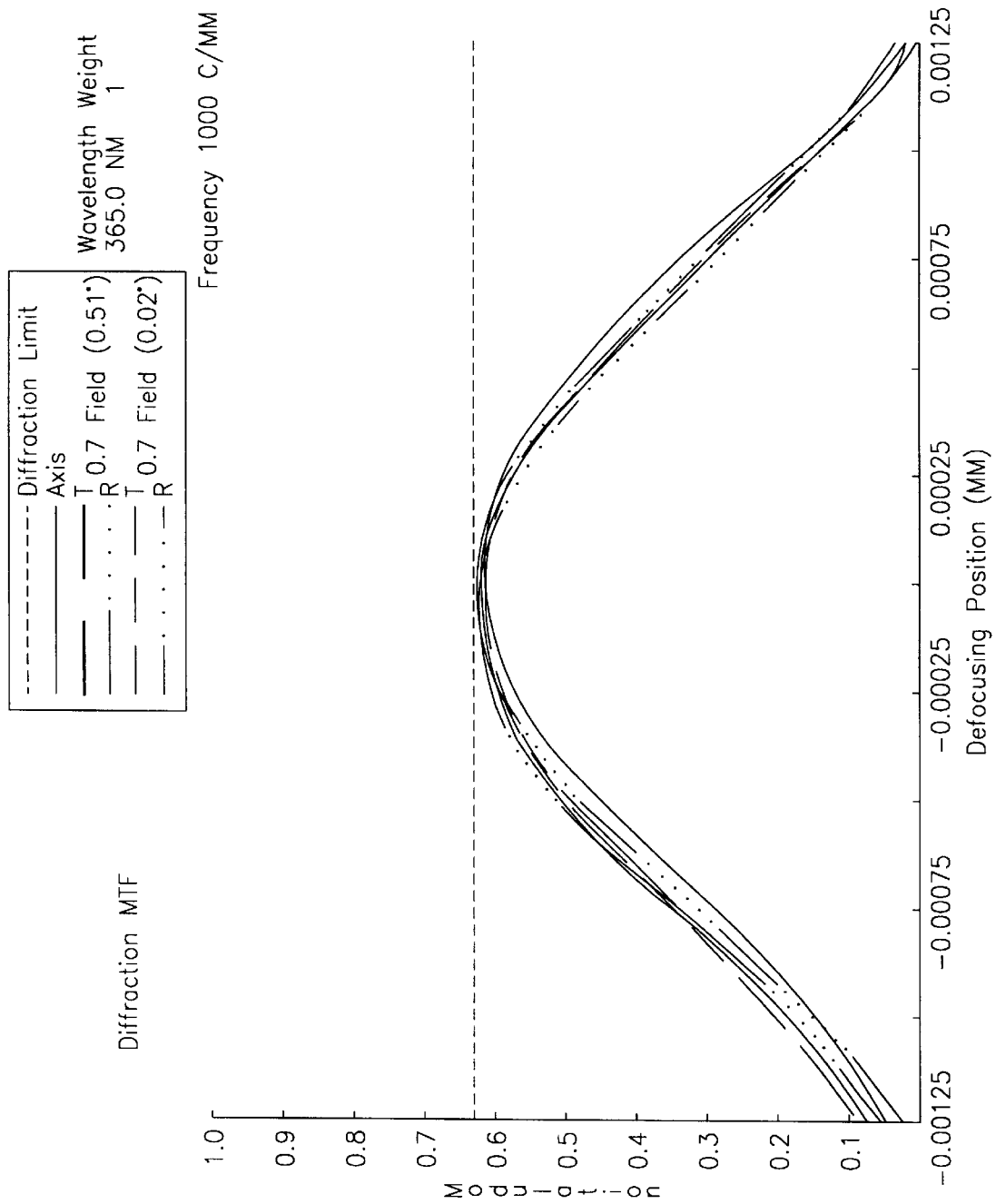
FIG. 7 is a graph of the Modulation Transfer Function (MTF) of the first embodiment of the present invention under ideal conditions.
Figure 8:
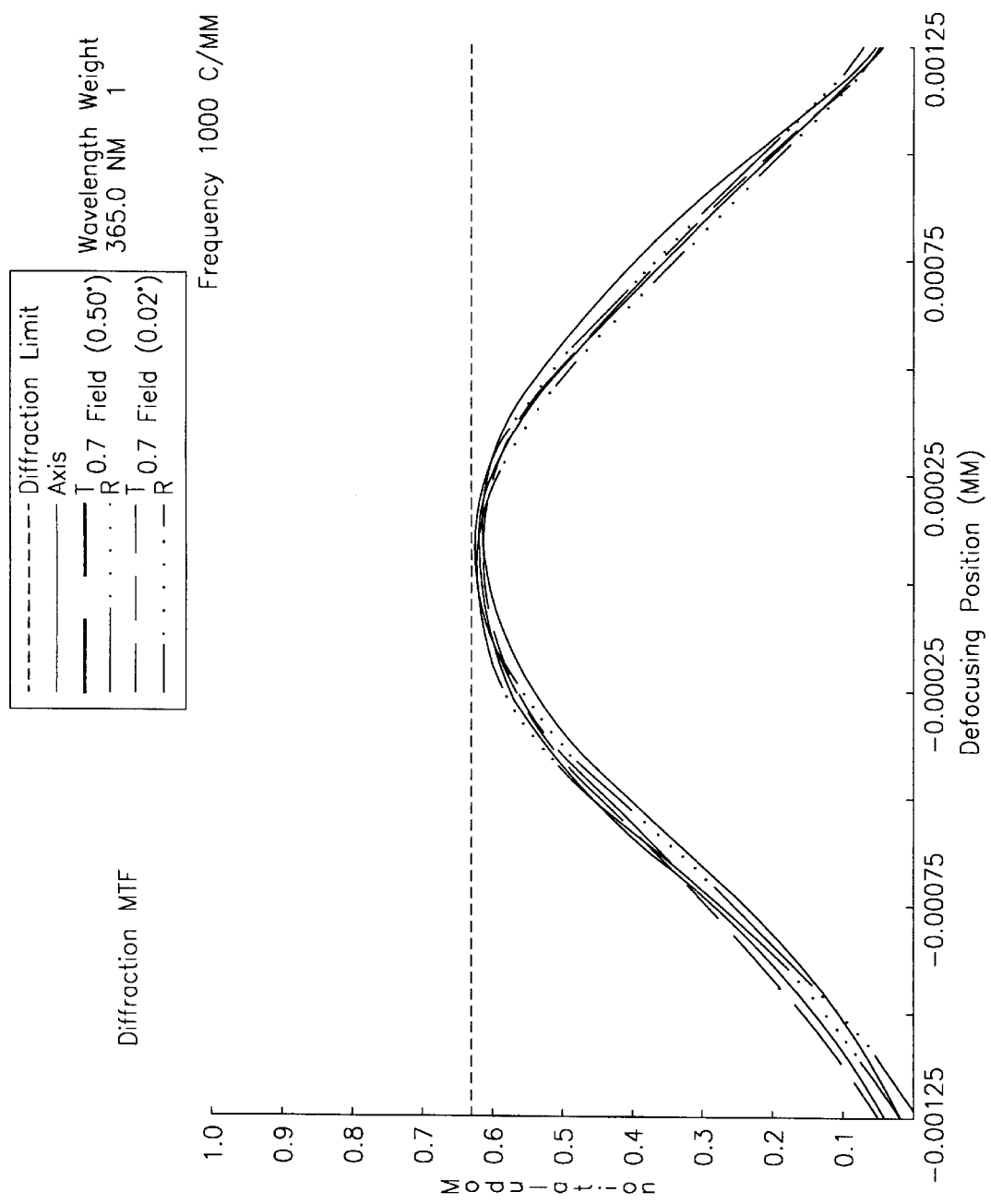
FIG. 8 is a graph of MTF of the first embodiment when atmospheric pressure changes by −100 mmHg from ideal conditions.

To illustrate the performance of the first embodiment of the present invention, FIG. 7 is a graph of incoherent MTF of the first embodiment scanned in focal direction in an ideal condition. In FIG. 7, the ordinate axis shows MTF contrast and the abscissa axis shows defocusing; T and R represent the tangential and radial directions, respectively. FIG. 8 shows MTF of the first embodiment when atmospheric pressure changes by −100 mmHg from the ideal condition. As FIGS. 7 and 8 clearly indicate, there is almost no deterioration in image contrast due to a change of atmospheric pressure in the first embodiment.

Figure 9D:
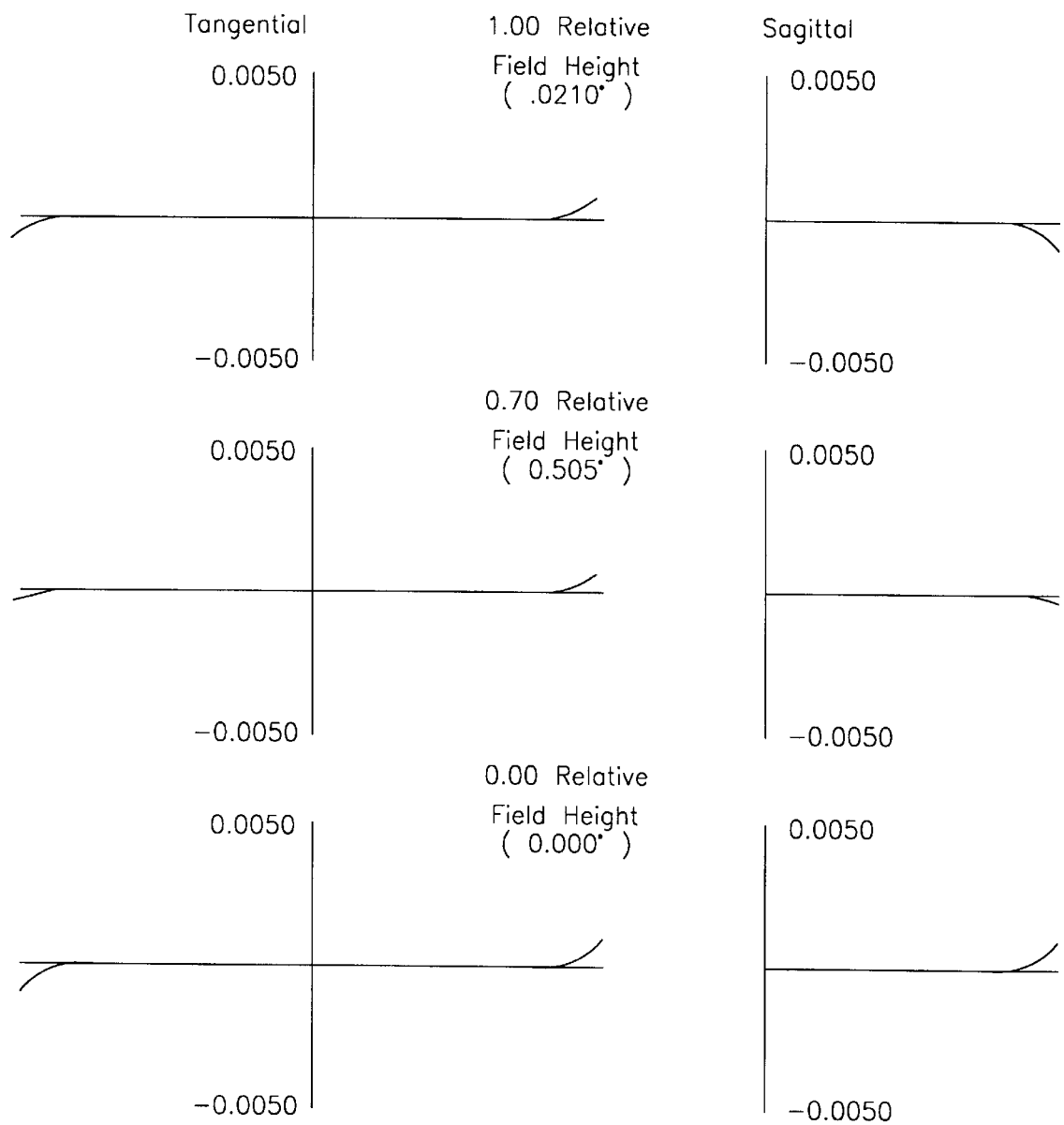
Figure 10D:
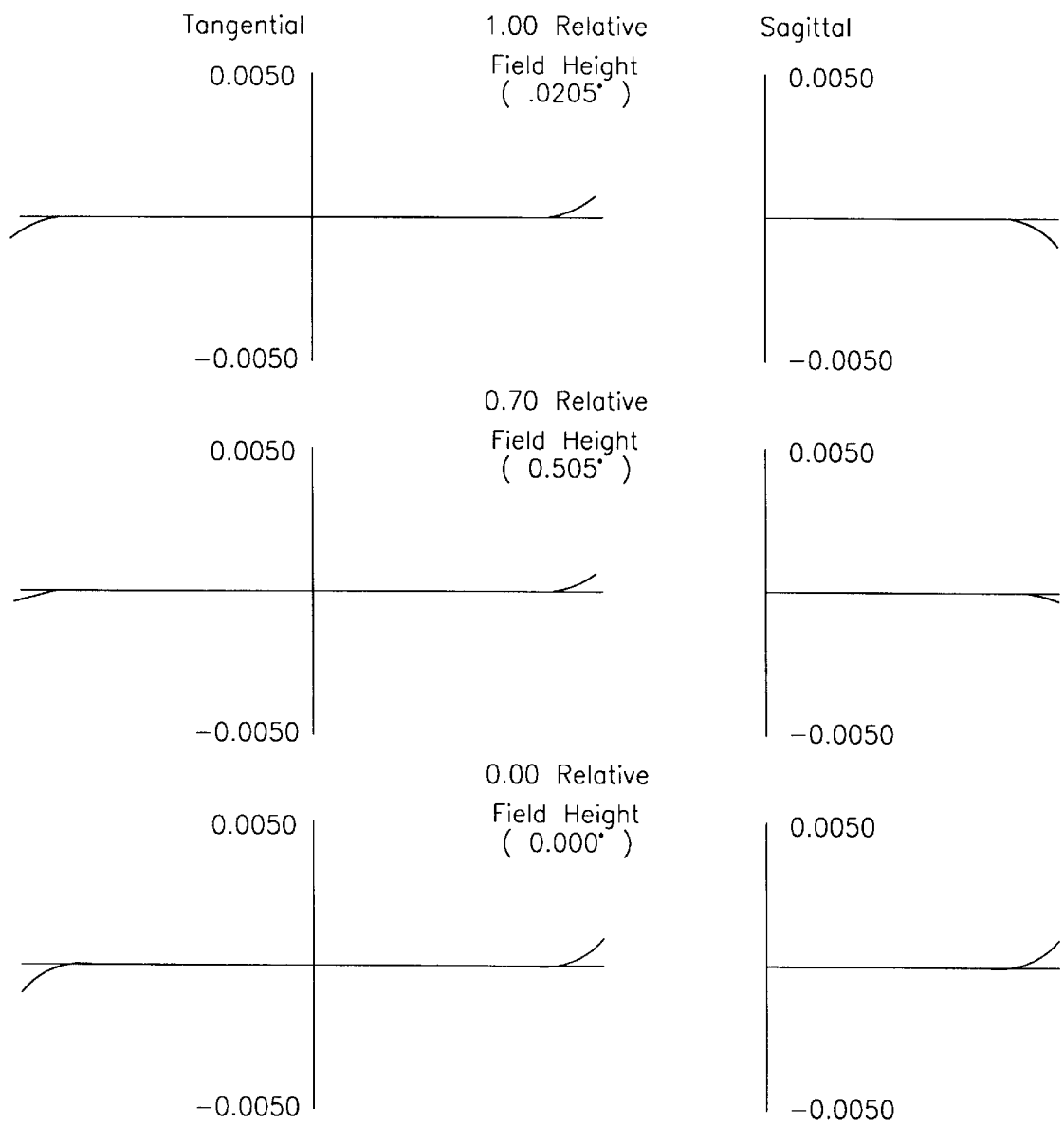

FIGS. 9A–9D show various aberrations of the projection optical system of the first embodiment in an ideal condition. FIG. 9A is a graph of spherical aberration, FIG. 9B is a graph of astigmatism, FIG. 9C is a graph of distortion, and FIG. 9D are graphs showing lateral aberration of tangential and sagittal directions at 100%, 70% and 0% image height. FIGS. 10A–10D show various aberrations of the projection optical system of the first embodiment in the condition where the atmospheric pressure changes by −30 mmHg from an ideal environment. FIG. 10A is a graph of spherical aberration, FIG. 10B is a graph of astigmatism and FIG. 10C is a graph showing distortion aberration and FIG. 10D are graphs showing lateral aberration of tangential and sagittal directions at 100%, 70% and 0% image height.

Table 7 shows the amount of change in spherical aberration, coma aberration, image height and meridional image surface for the first embodiment in the condition where the atmospheric pressure changes by −30 mmHg from an ideal condition.

TABLE 7

| spherical aberration | 0.062 μm |
| image height | 0.143 μm |
| meridional image surface | −0.010 μm |
| coma aberration | 0.014 μm |

As FIGS. 9A–9D, 10A–10D and table 7 clearly indicate, there is almost no change in spherical and coma aberrations due to atmospheric pressure change in the projection optical system of the first embodiment, and field curvature is kept to a small amount as well.

Table 8 shows changes in the aberrations from the ideal condition when atmospheric pressure within a portion of the multiple air gaps in the optical system is altered in order to correct magnification in the first embodiment. Specifically, the pressure in the gap between surface numbers 15 and 16 in above Table 1 is changed to −53.9 mmHg by the pressure control device PC.

TABLE 8

| spherical aberration | 0.040 μm |
| image height | 0.001 μm |
| meridional image surface | −0.028 μm |
| coma aberration | 0.016 μm |

Thus, by conducting magnification correction using the pressure control device PC, performances obtained in an ideal condition can be maintained in spite of significant changes in atmospheric pressure (−30 mmHg) in the actual use.

Figure 11D:
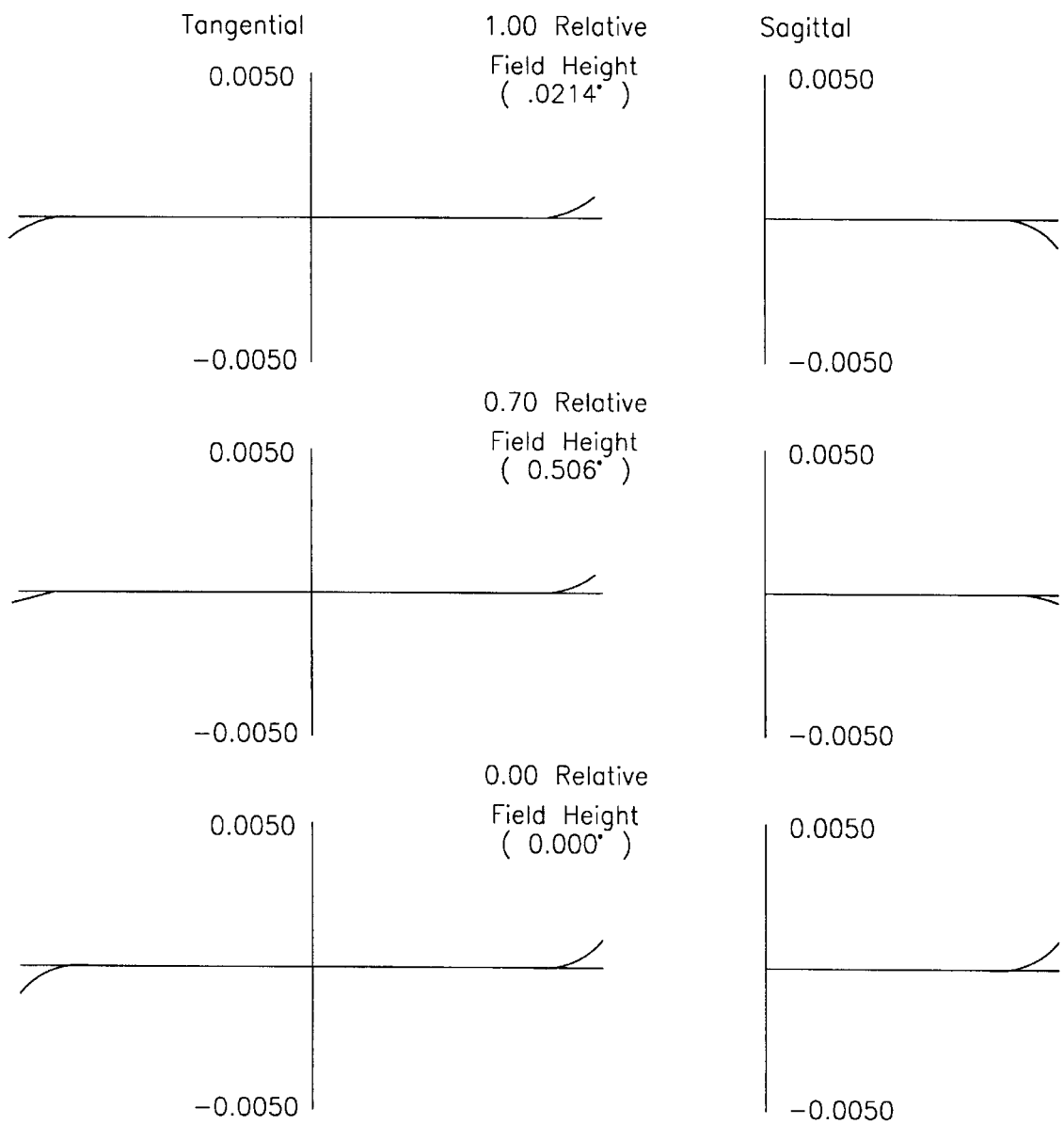

FIGS. 11A–11D show various aberrations of the projection optical system of the first embodiment in the condition where the temperature changes by 3° C. from the ideal condition. FIG. 11A is a graph of spherical aberration, FIG. 11B is a graph of astigmatism, FIG. 11C is a graph of distortion, and FIG. 11D includes graphs of lateral aberrations in tangential and saggital directions at 100%, 70% and 0% image height.

Table 9 shows the amount of change in spherical aberration, coma aberration, image height and meridional image surface for the first embodiment in the condition where the temperature changes by 3° C. from the ideal.

TABLE 9

| spherical aberration | −0.439 μm |
| image height | 0.009 μm |
| meridional image surface | 0.035 μm |
| coma aberration | −0.047 μm |

As FIGS. 9A–9D, 11A–11D, and Table 9 clearly indicate, the projection optical system of the first embodiment can maintain the performance it attains in ideal conditions in spite of a temperature change of 3° C.

Figure 12:
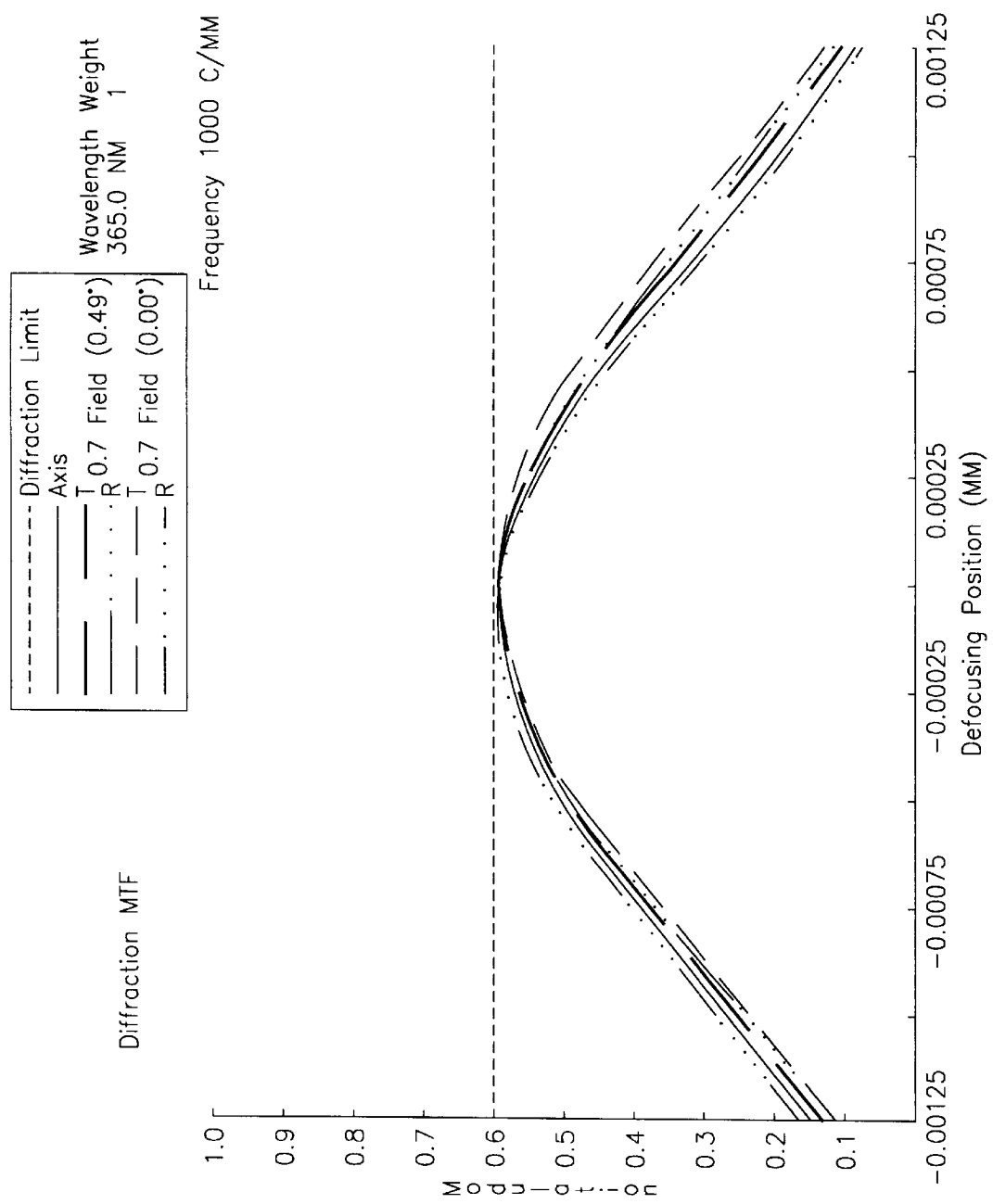
FIG. 12 is a graph of MTF of a second embodiment under ideal conditions.
Figure 13:
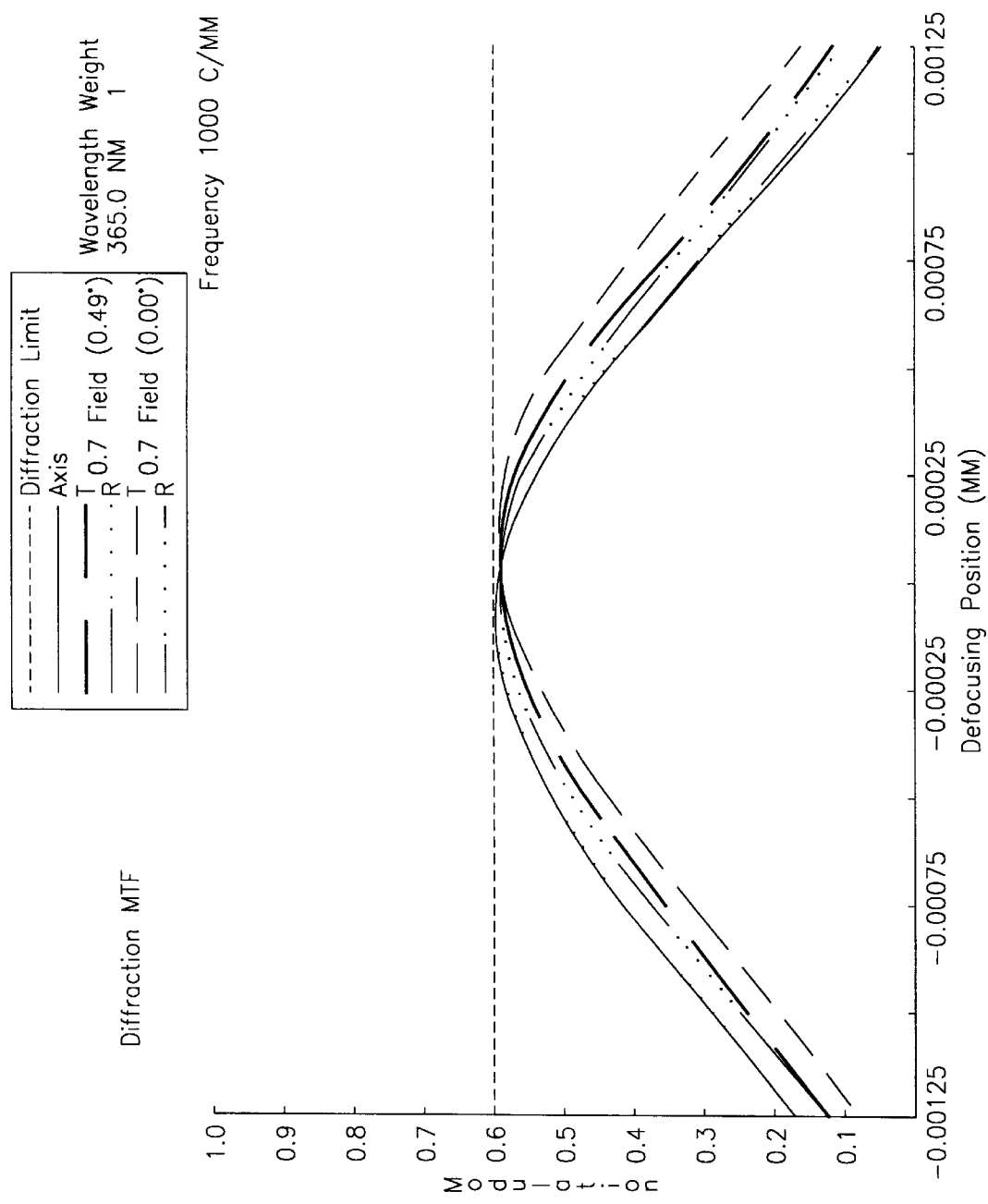
FIG. 13 is a graph of MTF of the second embodiment when the atmospheric pressure changes by −100 mmHg from ideal conditions.

FIG. 12 is a graph of incoherent MTF of the second embodiment scanned in the focal direction in the ideal condition. FIG. 13 is a graph of the same MTF when the atmospheric pressure changes by 100 mmHg in this embodiment. As FIGS. 12 and 13 clearly indicate, there is almost no deterioration of image contrast due to the atmospheric pressure change in the second embodiment.

Figure 14D:
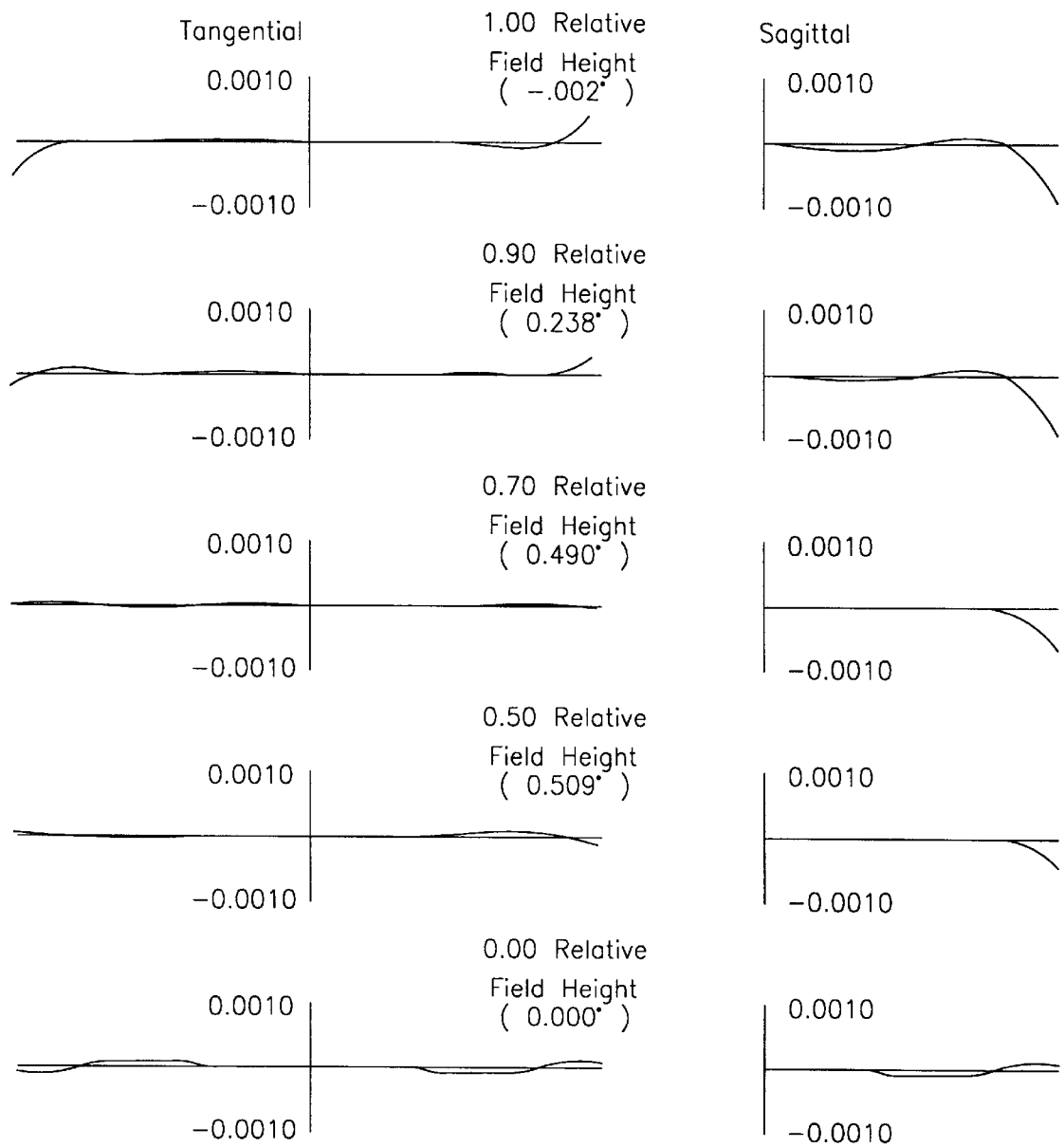
Figure 15D:
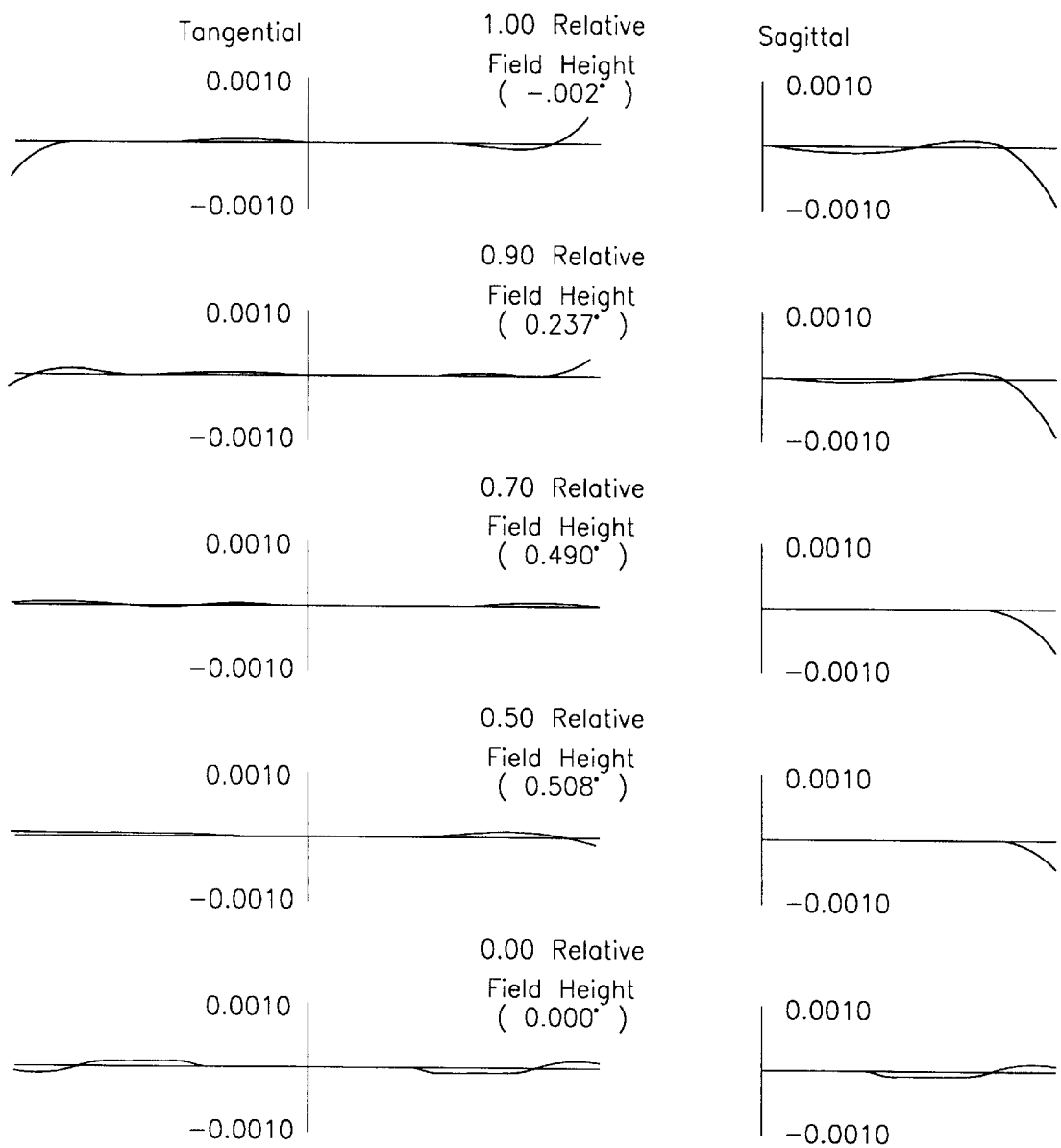

FIGS. 14A–14D show various aberrations of the projection optical system of the second embodiment under the ideal environment. FIG. 14A is a graph of spherical aberration, FIG. 14B is a graph of astigmatism, FIG. 14C is a graph of distortion and FIG. 14D shows lateral aberrations in tangential and sagittal directions at 100%, 70% and 0% image height. FIGS. 15A–15D show various aberrations of the projection optical system of the second embodiment in the condition where atmospheric pressure changes by −30 mmHg from the ideal. FIG. 15A is a graph of spherical aberration, FIG. 15B is a graph of astigmatism, FIG. 15C is a graph of distortion and FIG. 15D shows lateral aberrations in tangential and sagittal directions at 100%, 70% and 0% image height.

Table 10 shows the amount of change in spherical aberration, coma aberration, image height and meridional image surface in the condition where atmospheric pressure has changed by −30 mmHg from the ideal.

TABLE 10

| second embodiment | |
| --- | --- |
| spherical aberration | −0.002 μm |
| image height | 0.133 μm |
| meridional image surface | 0.021 μm |
| coma aberration | 0.005 μm |

As FIGS. 14A–14D, 15A–15D and table 10 clearly indicate, there is almost no change in amount of spherical and coma aberrations due to the atmospheric pressure change in the projection optical system of the second embodiment, and the change of field curvature is kept to a small amount.

Table 11 shows the change in the amount of aberrations from the ideal after the atmospheric pressure in a portion of the multiple air gaps within the optical system was modified in order to correct magnification in the second embodiment, where the pressure control device PC changes the pressure in the gap between surface numbers 15 and 16 in above table

2.

TABLE 11

| spherical aberration | −0.021 μm |
| --- | --- |
| image height | 0.001 μm |
| meridional image surface | 0.000 μm |
| coma aberration | 0.006 μm |

Thus, by having the pressure control device PC conduct magnification correction, performance obtained in the ideal condition can be maintained at the actual use site in spite of a significant change in the atmospheric pressure (by −30 mmHg).

Figure 16D:
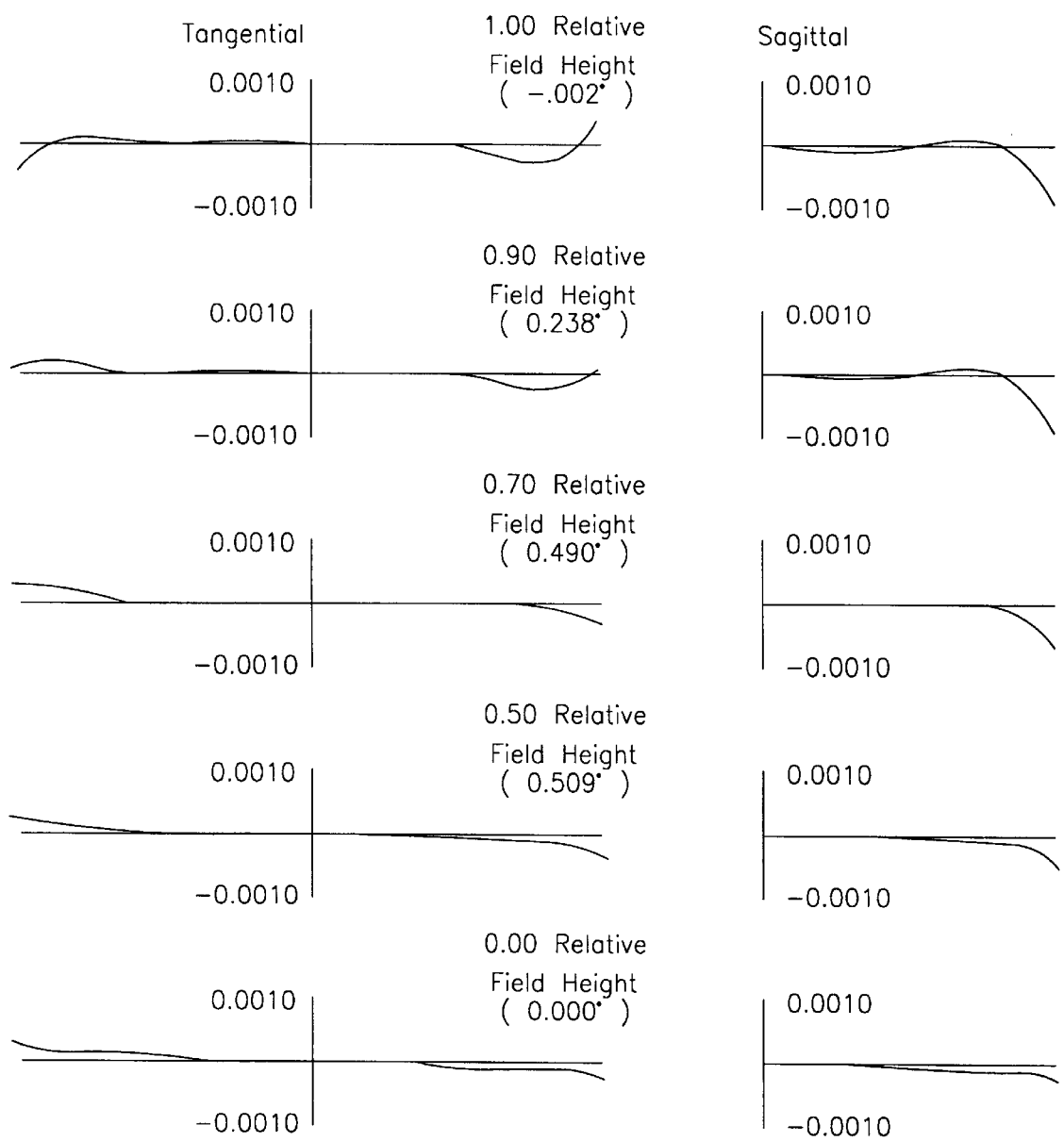

FIGS. 16A–16D show various aberrations of the projection optical system of the second embodiment in the condition where the temperature changes by 3° C. from the ideal. FIG. 16A is a graph of spherical aberration, FIG. 16B is a graph of astigmatism, FIG. 16C is a graph of distortion and FIG. 16D shows lateral aberrations in tangential and sagittal directions at 100%, 70% and 0% image height.

Table 12 shows change in the amount of spherical aberration, coma aberration, image height and meridional image surface for the second embodiment when the temperature has changed by 3° C. from the ideal.

TABLE 12

| spherical aberration | −0.427 μm |
| --- | --- |
| image height | −0.004 μm |
| meridional image surface | 0.076 μm |
| coma aberration | 0.044 μm |

As FIGS. 14A–14D, 16A–16D and table 12 clearly indicate, the projection optical system of the second embodiment can maintain the same performance as in an ideal environment in spite of temperature change of 3° C.

The projection optical systems of the first and second embodiments of this invention have a large numerical aperture of 0.55 or more on the image side, have a large exposure field of 30 mm or more on the second object, and their imaging performance either in an ideal environment and in changed atmospheric pressure or temperature conditions is highly favorable.

By applying this projection optical system to a projection exposure apparatus as shown in FIG. 1, circuit patterns on reticle can be transferred finely not only under an ideal conditions, but in environments which differ significantly from the ideal.

While each embodiment discussed above uses a mercury lamp which supplies i-line (365 nm) as the exposure light source, the present invention is also usable with other light sources, such as a mercury lamp which supplies g-line (465 nm) exposure light, or deep ultra violet (DUV) light source such as excimer laser which supplies 193 nm or 248 nm wavelength. The projection optical system of the present invention is applicable to a variety of lithography systems, including but not limited to a so-called step and repeat exposure system or step and scan exposure system.

As those skilled in the art of projection optical systems will readily appreciate, numerous substitutions, modifications and additions may be made to the above design without departing from the spirit and scope of the present invention. It is intended that all such substitutions, modifications and additions fall within the scope of this invention which is best defined by the claims appended below.

What is claimed is:

1. A projection optical system which projects an image of a first object onto a second object, said system comprising, from a side of said first object, a first lens group having a positive refractive power, a second lens group having a negative refractive power, a third lens group having a positive refractive power, a fourth lens group having a negative refractive power, a fifth lens group having a positive refractive power and an aperture stop placed within said fifth lens group, wherein said third lens group includes first and second meniscus lens elements each having a positive refractive power with a concave surface directed to said first object side, and third and fourth meniscus lens elements each having a positive refractive power with a concave surface directed to a side of said second object, wherein a lens element having a maximum effective diameter of said third lens group is disposed between said first meniscus lens element and said fourth meniscus lens element.

2. A projection optical system according to claim 1, wherein said lens elements comprising said third lens group satisfy the following conditions:

$|\sin(\beta)|<0.5$ $|(\alpha-\beta)/(\alpha-\gamma)|<1.5$, where,

α is at least one of an incident angle of a principal ray corresponding to a maximum image height of said projection optical system to a first object side lens surface of said lens element and an emergent angle of the principal ray corresponding to the maximum image height of said projection optical system from a second object side lens surface of said lens element, β is at least one of an incident angle of a lower meridional ray corresponding to the maximum image height of said projection optical system to the first object side lens surface of said lens element, and an emergent angle of the lower meridional ray corresponding to the maximum image height of said projection optical system from the second object side lens surface of said lens element, and γ is at least one of an incident angle of an upper meridional ray corresponding to the maximum image height of said projection optical system to the first object side lens surface of said lens element, and an emergent angle of the upper meridional ray corresponding to the maximum image height of said projection optical system from the second object side lens surface of said lens element.

3. The projection optical system according to claim 1, wherein said fifth lens group has first and second air-spaced doublets each including a positive and a negative lens element, where said first and second air-spaced doublets are placed a side closer to a second-object side from said aperture stop, and at least one of said positive and negative lens elements comprising said first and second air-spaced doublets has a maximum effective diameter among said fifth lens group.

4. The projection optical system according to claim 2, wherein said fifth lens group has first and second air-spaced doublets each including a positive and a negative lens element, wherein said first and second air-spaced doublets are placed on a side closer to said second object from said aperture stop, and at least one of said positive and negative lens elements of said first and second air-spaced doublets has a maximum effective diameter among the fifth lens group.

5. The projection optical system according to claim 1, wherein the first meniscus lens of said third lens group is placed closest to said first object among said lenses of said third lens group, and the fourth meniscus lens is placed closest to the second object among said lenses of said third lens group.

6. The projection optical system according to claim 5, wherein said third lens group is comprised of positive lens elements.

7. The projection optical system according to claim 1, further comprising a lens barrel including a plurality of supporting members, said plurality of supporting members supporting said first, second, third, fourth and fifth lens groups, wherein said supporting members and said lens barrel are made of a same material.

8. The projection optical system according to claim 1 further includes a plurality of lens barrels, said plurality of lens barrels supporting said first, second, third, fourth and fifth lens groups, said plurality of lens barrels being arranged along an optical axis of said projection optical system.

9. A projection optical system according to claim 1, wherein said projection optical system and said first, second third, fourth and fifth lens groups satisfy the following conditions:

$$0.10 < f1/L < 0.25$$

$$-0.09 < f2/L < -0.03$$

$$0.05 < f3/L < 0.20$$

$$-0.10 < f4/L < -0.02$$

$$0.05 < f5/L < 0.20,$$

where,
- f1 is the focal length of said first lens group,
- f2 is the focal length of said second lens group,
- f3 is the focal length of said third lens group,
- f4 is the focal length of said fourth lens group,
- f5 is the focal length of said fifth lens group, and
- L is the distance between the object and the image.

10. A projection optical system which projects an image of a first object onto a second object, said system comprising, from a side of said first object, a first lens group having a positive refractive power, a second lens group having a negative refractive power, a third lens group having a positive refractive power, a fourth lens group having a negative refractive power, a fifth lens group having a positive refractive power and an aperture stop placed within said fifth lens group, wherein said fifth lens group has first and second air-spaced doublets each including a positive lens element and a negative lens elements, said first and second air-spaced doublets being disposed on a side of said projection optical system closer to said second object from said aperture stop, and at least one of said positive and negative lens elements comprising said first and second air-spaced doublets has a maximum effective diameter in said fifth lens group.

* * * * *

UNITED STATES PATENT AND TRADEMARK OFFICE
CERTIFICATE OF CORRECTION

PATENT NO. : 5,920,379

DATED : Jul. 6, 1999

INVENTOR(S) : MATSUYAMA

It is certified that error appears in the above-identified patent and that said Letters Patent is hereby corrected as shown below:

On the cover page, replace Related U.S. Application Data "Pat. No. 5,822,044" with --Pat. No. 5,852,490--; and Col. 1, line 6 replace "5,822,044" with --5,852,490--.

Signed and Sealed this

Eighteenth Day of April, 2000

Attest:

Q. TODD DICKINSON

*Attesting Officer*      *Director of Patents and Trademarks*